United States Patent
Murayama

(10) Patent No.: US 8,259,140 B2
(45) Date of Patent: Sep. 4, 2012

(54) METHOD OF CONTROLLING AN IMAGE DISPLAY APPARATUS

(75) Inventor: Kazuhiko Murayama, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 821 days.

(21) Appl. No.: 12/412,941

(22) Filed: Mar. 27, 2009

(65) Prior Publication Data

US 2009/0244038 A1 Oct. 1, 2009

(30) Foreign Application Priority Data

Apr. 1, 2008 (JP) ................................. 2008-095453

(51) Int. Cl.
*G06F 3/038* (2006.01)

(52) U.S. Cl. ..................................................... 345/691

(58) Field of Classification Search .................. None
See application file for complete search history.

(56) References Cited

U.S. PATENT DOCUMENTS

| | | | |
|---|---|---|---|
| 5,687,067 A | 11/1997 | Majid et al. | |
| 6,466,186 B1 * | 10/2002 | Shimizu et al. | 345/60 |
| 6,768,479 B2 * | 7/2004 | Nakamura | 345/60 |
| 6,995,516 B2 | 2/2006 | Aoki et al. | 315/169.3 |
| 7,573,472 B2 * | 8/2009 | Aoki et al. | 345/208 |
| 8,009,154 B2 * | 8/2011 | Lee | 345/204 |
| 2001/0033277 A1 | 10/2001 | Sandoe et al. | |
| 2002/0018056 A1 * | 2/2002 | Ozawa et al. | 345/204 |
| 2005/0264499 A1 * | 12/2005 | Kim et al. | 345/76 |
| 2006/0050030 A1 | 3/2006 | Aoki et al. | 345/76 |
| 2006/0066523 A1 | 3/2006 | Arai et al. | |
| 2006/0082317 A1 * | 4/2006 | Ohwada et al. | 315/167 |
| 2006/0132052 A1 * | 6/2006 | Ohwada et al. | 315/169.3 |
| 2009/0244038 A1 * | 10/2009 | Murayama | 345/204 |
| 2009/0289884 A1 * | 11/2009 | Yanagi et al. | 345/92 |
| 2010/0079433 A1 * | 4/2010 | Ishiguro et al. | 345/211 |
| 2010/0225671 A1 * | 9/2010 | Makino et al. | 345/690 |

FOREIGN PATENT DOCUMENTS

| | | |
|---|---|---|
| EP | 1 465 144 A2 | 6/2004 |
| EP | 1 605 432 A2 | 12/2005 |
| EP | 1 650 732 A2 | 4/2006 |
| JP | 2003-173159 | 6/2003 |

OTHER PUBLICATIONS

European Office Action dated Jan. 10, 2010, in related corresponding European Patent Application No. 09156876.6.
European Search Report dated Apr. 6, 2010, in related corresponding European Patent Application No. 09156876.6.
European Office Action dated Jan. 10, 2011, in related corresponding European Patent Application No. 09156876.6.

\* cited by examiner

*Primary Examiner* — Peter Vincent Agustin
(74) *Attorney, Agent, or Firm* — Fitzpatrick, Cella, Harper & Scinto

(57) ABSTRACT

A method is provided to control an image display apparatus having a display panel in which a plurality of display devices are arranged in matrix with a plurality of column wires and a plurality of row wires. The method includes the steps of outputting a selection electric potential to a row wire to be driven, and generating a modulated pulse based on image data and outputting the modulated pulse to the column wires.

3 Claims, 23 Drawing Sheets

| Tr | H | L | L |
|---|---|---|---|
| Level | V4 | V4 | V4 |
| Tr | H | H | L |
| note | SEL selects Tr_OUT and outputs rising waveform. A17C takes in voltage of REF_WF. | SEL switches Tr_OUT to LEVEL_OUT and outputs V4 voltage. A17C continues to take in voltage of REF_WF. | SEL switches LEVEL to Tf_OUT. Tf_OUT outputs waveform falling from V4. |

| Tr | H | L | L |
|---|---|---|---|
| Level | V3 | V3 | V3 |
| Tr | H | H | L |
| note | SEL selects Tr_OUT and outputs rising waveform. A17C takes in voltage of REF_WF. | SEL switches Tr_OUT to LEVEL_OUT and outputs V3 voltage. A17C continues to take in voltage of REF_WF. | SEL switches LEVEL to Tf_OUT. Tf_OUT outputs waveform falling from V3. |

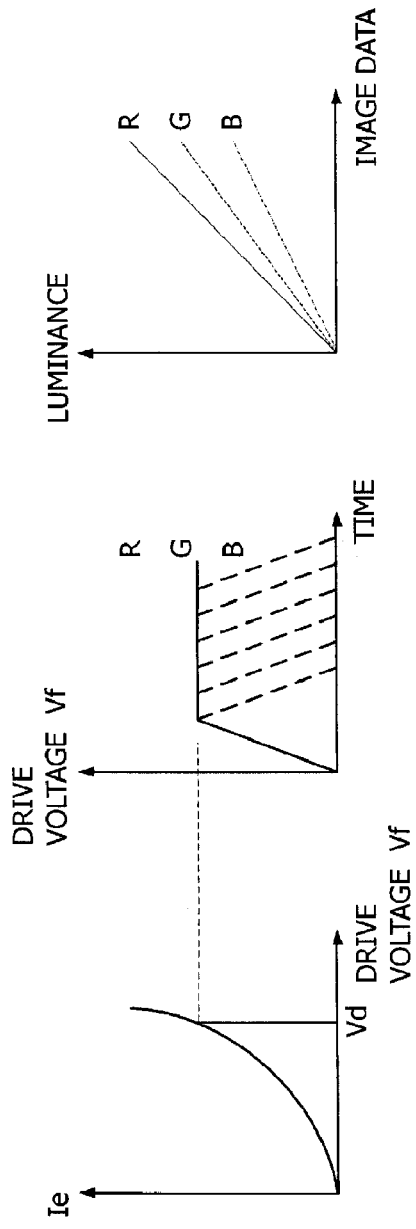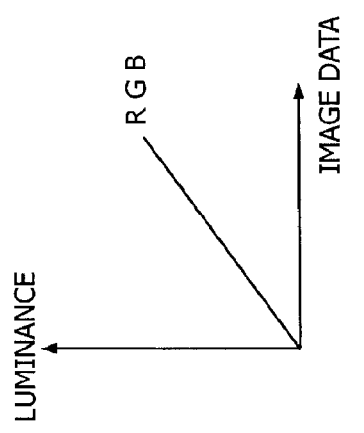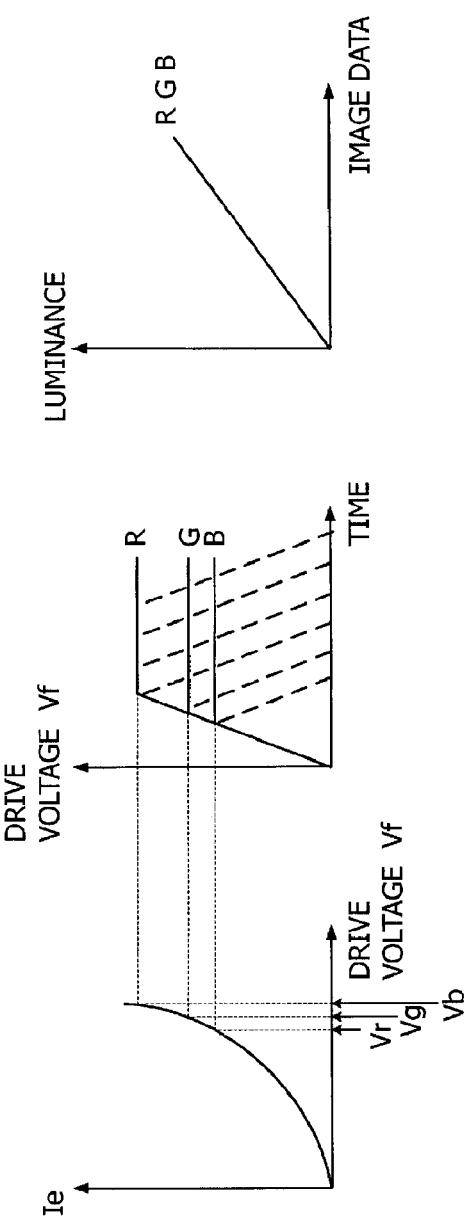

| Tr | H | L |
|---|---|---|
| Level | V1 | V1 |
| Tr | H | L |
| note | SEL selects Tr_OUT and outputs rising waveform. A17C takes in voltage of REF_WF. | SEL switches Tr_OUT to Tf_OUT. Tf_OUT outputs waveform falling grom REF_WF. |

| Tr | H | L | L |
|---|---|---|---|
| Level | V4 | V4 | V4 |
| LEVEL_cont | L | H | L |
| Tr | H | H | L |
| note | SEL selects Tr_OUT and outputs rising waveform. A17C takes in voltage of REF_WF. | SEL switches Tr_OUT to LEVEL_OUT and outputs V1 voltage. A17C continues to take in voltage of REF_WF. | SEL switches LEVEL to Tf_OUT. Tf_OUT outputs waveform falling from V1. |

Fig. 22

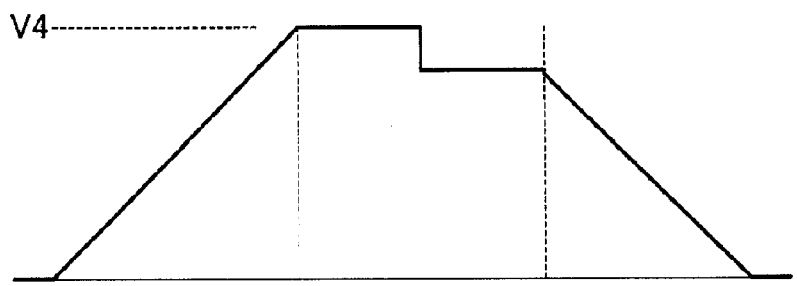

| Tr | H | H/L(※) | | H/L(※) |
|---|---|---|---|---|
| Level | V4 | V4 | V3 | V4 |
| LEVEL_cont | L | H | | L |
| Tr | H | H | | L |
| note | SEL selects Tr_OUT and outputs rising waveform. A17C takes in voltage of REF_WF. | SEL switches Tr_OUT to LEVEL_OUT and outputs V4 voltage. SEL outputs V3 voltage after LEVEL changes from V4 to V3. A17C continues to take in voltage of REF_WF. | | SEL switches LEVEL to Tf_OUT. Tf_OUT outputs waveform falling from V1. |

\* Due to sharing of a common rising circuit, the control signal Tr is set to High level while there is another output circuit in rising state, and is set to Low level after all the output circuits complete rising.

METHOD OF CONTROLLING AN IMAGE DISPLAY APPARATUS

BACKGROUND OF THE INVENTION

1. Field of the Invention

The present invention relates to an image display apparatus and a control method of the same.

2. Description of the Related Art

There are known flat display apparatuses such as a display apparatus using an electron-emitting device (electron beam display apparatus), a liquid crystal display apparatus, a plasma display apparatus, an organic EL display apparatus, and the like. These types of the image display apparatuses have a display panel (matrix panel), to which a lot of display devices are provided in a matrix pattern, and a drive circuit for driving the display devices. In general, a modulation signal (modulated pulse), which is modulated according to an image signal, is supplied to a display device to be driven. A pulse width modulation, an amplitude modulation, and the like are known as a modulation system.

Japanese Patent Application Laid-Open No. 2003-173159 discloses a modulation system using the pulse width modulation and the amplitude modulation in combination. Further, the document discloses a modulation circuit in which a pulse waveform rises and falls stepwise.

SUMMARY OF THE INVENTION

Stepwise rising and falling of a pulse waveform could somewhat suppress disturbance (overshoot, ringing, and the like) of the waveform at a voltage transition, as disclosed in Japanese Patent Application Laid-Open No. 2003-173159.

However, as a display panel is arranged to display a much finer image and to be driven at a higher speed, it is desired to further suppress disturbance of the waveform at a voltage transition for more stabilized drive of the display panel. Particularly in a matrix drive type image display apparatus such as an electron beam display apparatus, since a matrix panel has a large capacity and its drive voltage is high, it is desired to reduce high-frequency components contained in a pulse waveform as much as possible.

An object of the present invention is to provide a technique for suppressing disturbance of a modulated pulse waveform at a voltage transition.

To achieve the above object, the present invention employs the following constitution.

A first aspect of the present invention is an image display apparatus having a display panel in which a plurality of display devices are arranged in matrix with a plurality of column wires and a plurality of row wires, a scan circuit for outputting a selection electric potential to a row wire to be driven, and a modulation circuit for generating a modulated pulse based on image data and outputting the modulated pulse to the column wires, wherein the modulation circuit has a first waveform generation unit for generating a first waveform which rises in a slope shape, a second waveform generation unit for generating a second waveform which defines a pulse height value, a third waveform generation unit for generating a third waveform which falls in a slope shape, and a waveform switching unit for generating a waveform of the modulated pulse by combining the first waveform and the third waveform or the first waveform, the second waveform, and the third waveform according to a control signal generated based on the image data.

A second aspect of the present invention is a control method of an image display apparatus which has a display panel in which a plurality of display devices are arranged in matrix with a plurality of column wires and a plurality of row wires, the control method having a step of outputting a selection electric potential to a row wire to be driven; and a step of generating a modulated pulse based on image data and outputting the modulated pulse to the column wires, wherein in the step of generating and outputting the modulated pulse, supposing that n is an integer of at least 1, $t_2$ is a value larger than $t_1$, $h_2$ is a value larger than $h_1$, k is an integer of at least 1, and $f(k)$ increases as k is increased, (1) in case of outputting a modulated pulse corresponding to gradation value n, a control is executed to cause the modulated pulse to rise in a slope shape so that the pulse height value reaches $h_1$ in a period of time $t_1$ from the start time of outputting the modulated pulse and to cause the modulated pulse to fall so that the pulse height value decreases from the time at which the period of time $t_1$ has passed from the start time of outputting the modulated pulse, and (2) in case of outputting a modulated pulse corresponding to gradation value n+k, a control is executed to cause the modulated pulse to rise in a slope shape so that a pulse height value reaches $h_2$ in a period of time $t_2$ from the start time of outputting the modulated pulse, to hold the pulse height value at $h_2$ until a period of time $t_2+f(k)$ passes from the start time of outputting the modulated pulse, and thereafter to cause the pulse height value to decrease.

According to the present invention, disturbance of a modulated pulse waveform can be suppressed at a voltage transition.

BRIEF DESCRIPTION OF THE DRAWINGS

FIGS. 15A and 15D show drive voltage/emission current characteristics of an electron-emitting device, FIGS. 15B and 15E show waveforms of the RGB modulated pulses, and FIGS. 15C and 15F show luminance characteristics response to RGB image data;

FIG. 22 is a logic table of the operation example 5; and

DESCRIPTION OF THE EMBODIMENTS

Figure 1:
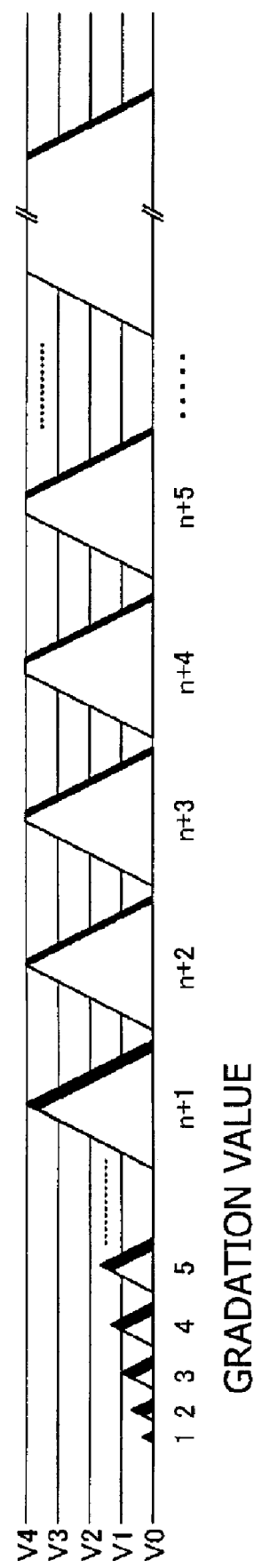
FIG. 1 is a view showing an example of a waveform of a modulated pulse.

Preferable embodiments of the present invention will be exemplarily explained below in detail referring to the drawings.

The present invention can be preferably applied to an image display apparatus having a display panel (matrix panel) to which a plurality of display devices are arranged in matrix with a plurality of column wires and a plurality of row wires. This type of the image display apparatus includes, for example, electron beam display apparatuses, plasma display apparatuses, organic EL display apparatuses, and the like. In particular, the present invention is preferably applied to electron beam display apparatuses since electron beam display apparatuses have a large wiring capacitance and a large device capacitance of a matrix panel and a large drive voltage is supplied to their devices. Electron beam display apparatuses preferably employ a cold cathode device (electron-emitting device) such as an FE electron-emitting device, an MIM electron-emitting device, a surface conduction electron-emitting device, and the like as a display device.

The image display apparatus has a scan circuit and a modulation circuit as a drive means for driving the display panel. The scan circuit is a circuit for outputting selection electric potential to one or more row wires to be driven, and the modulation circuit is a circuit for generating a modulated pulse based on image data and outputting the modulated pulse to the column wires. The modulation circuit of the embodiment generates a waveform (source waveform) of the modulated pulse by appropriately combining a first waveform which rises in a slope shape, a second waveform for defining a pulse height value, and a third waveform which falls in a slope shape. The modulation circuit has a logic circuit for generating a control signal for controlling a waveform based on the image data. The control signal can arbitrarily control timing at which the first waveform, the second waveform, and the third waveform are switched, and the pulse height value of the second waveform, and the like.

Modulation pulses, which can be output by the modulation circuit of the embodiment, will be exemplified below. Since any of the modulated pulses rises and falls in a gentle slope shape, a waveform disturbance such as overshoot, undershoot, ringing, and the like can be suppressed as much as possible at a voltage transition. Accordingly, the gradation property of the image display apparatus can be enhanced.

EXAMPLE 1 OF MODULATION PULSE

A triangular pulse can be generated by outputting a third waveform following to a first waveform. A large pulse, i.e., a pulse corresponding to a large gradation value can be generated by delaying timing of switching the first waveform to the third waveform.

EXAMPLE 2 OF MODULATION PULSE

A trapezoidal pulse can be generated by causing a pulse to rise up to a pulse height value h by the first waveform, keeping the pulse height value h by the second waveform, and causing the pulse to fall from the pulse height value h by the third waveform. A pulse corresponding to a large gradation value can be generated by increasing a time during which the second waveform is output.

EXAMPLE 3 OF MODULATION PULSE

A triangular pulse and a trapezoidal pulse can be separately used depending on a gradation value. For example, the following control (1) is executed in a gradation value n (n is an integer of at least 1), and the following control (2) is executed in a gradation value from n+1 to n+k (k is an integer of at least 1).

(1) When a modulated pulse corresponding to the gradation value n is output:

A modulated pulse is caused to raise its pulse height value up to h1 in a slope shape during a period of time t1 from the starting time of outputting the modulated pulse, and the modulated pulse is caused to fall after the period of time t1 has passed from the start time of outputting the modulated pulse so that the pulse height value is reduced.

(2) When a modulated pulse corresponding to a gradation value n+k is output:

A modulated pulse is caused to raise its pulse height value up to h2 in a slope shape during a period of time t2 after the modulated pulse starts to be output, the pulse height value h2 is held until a period of time t2+f(k) passes after the modulated pulse starts to be output, and thereafter the modulated pulse is caused to fall so that the pulse height value is reduced.

Here, t2>t1, and h2>h1. And, f(k) increases as k increases. Although f(k) is typically a linear function of k, it is not limited to the linear function as long as it is a function increasing monotonically.

The above control (2) is a control for extending the pulse width (the length of the flat portion of a trapezoidal waveform) according to a gradation value. Note that when f(k) is 0 at the time k=1, the pulse of the control (2) is made to a triangular pulse. The triangular pulse obtained in the above control (1) corresponds to a pulse smaller by one gradation than the pulse obtained in the control (2) when k=1. This control realizes display of lower luminance than that can be expressed by pulse width modulating of a trapezoidal pulse (that is, luminance when k=1), thus enhancing the gradation property of the image display apparatus.

Further, the following control (3) is preferably executed.

(3) When a modulated pulse corresponding to a gradation value n-1 is output:

A modulated pulse is caused to raise its pulse height value up to h3 in a slope shape during a period of time t3 from the start time of outputting the modulated pulse, and the modulated pulse is caused to fall after the period of time t3 has passed from the start time of outputting the modulated pulse so that the pulse height value is reduced. Here, t3<t1, and h3<h1.

The control (3) generates a triangular pulse smaller than the pulse of the control (1). Since luminance having a smaller amount can be realized by the control (3), the gradation property of the image display apparatus can be more enhanced. Note that a triangular pulse smaller than that generated by the control (3) may be generated by the same manner.

Figure 2:
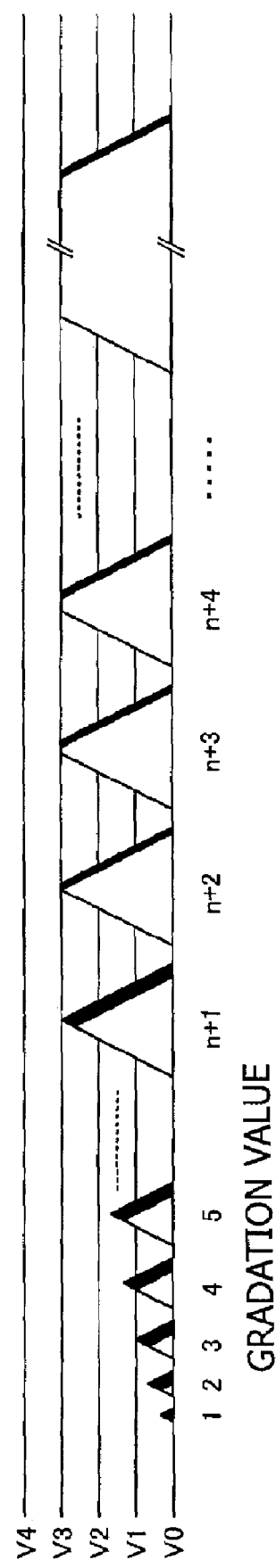
FIG. 2 is a view showing an example of the waveform of the modulated pulse.

FIGS. 1 and 2 show examples of waveforms of modulated pulses. In the examples, triangular pulses are gradually increased with gradation values increasing from 1 to n, and the pulse widths of trapezoidal pulses are gradually increased with the gradation values increasing from n+1. Note that the black portion of a pulse waveform shows a difference from a pulse waveform located in front of it by one gradation. In FIG. 1 the maximum pulse height value of the modulated pulses is at a V4 level, and in FIG. 2 the maximum pulse height value of the modulated pulses is at a V3 level (V4>V3). The modulated pulse of FIG. 1 can express luminance higher than that of the modulated pulse of FIG. 2. The control of FIG. 1 is preferably used, for example, when displaying an image which is preferably displayed with high luminance or when a high luminance display mode is selected. Further, the control of FIG. 2 is preferably used when displaying an image which is preferably displayed with low luminance or when a low luminance display mode is selected. Much lower luminance can be realized by setting the maximum pulse height value to V1 or V2. Further, as described later, it is also preferable to change the maximum pulse height value of each color to correct a difference between light emission efficiencies of fluorescents.

EXAMPLE 4 OF MODULATION PULSE

Figure 3:
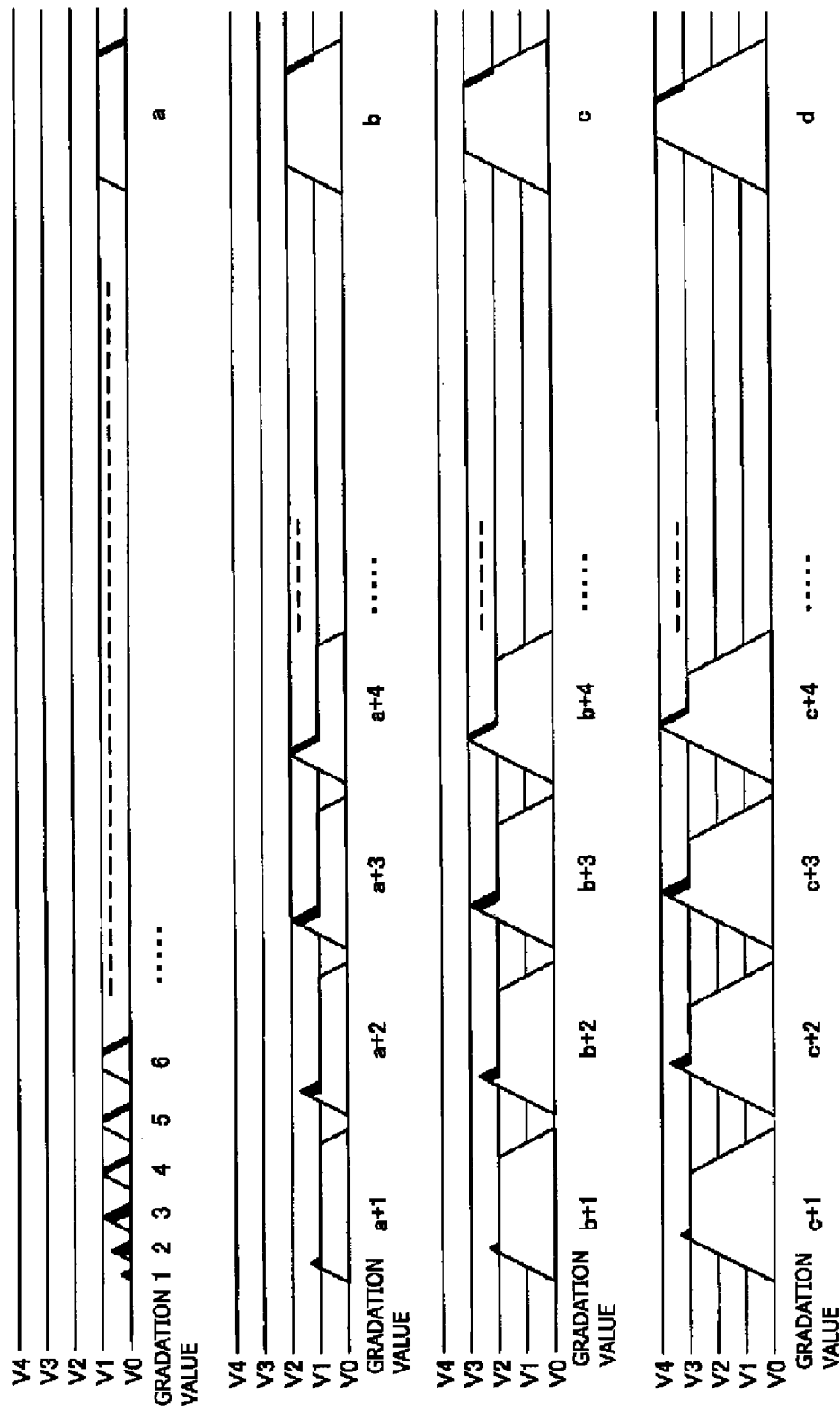
FIG. 3 is a view showing an example of the waveform of the modulated pulse.

FIG. 3 shows another example of the waveform of the modulated pulse. Symbols a, b, c, d show an integer and have the relation of 1<a<b<c<d. Controls for gradation values from 1 to "a" are the same as the controls (1) to (3) explained in the example 3 of the modulated pulse. For gradation values from a+1 to b, a control for superimposing a triangular or trapezoidal pulse (maximum pulse height value: V2) on a trapezoidal pulse (maximum pulse height value: V1) for gradation value "a" is executed.

In, for example, a waveform having gradation values a+1 to a+3, the waveform is caused to rise up to Vx (V1<Vx<V2) with the first waveform, to fall from Vx to V1 with the third waveform, to hold at V1 with the second waveform, and then to fall from V1 to V0 with the third waveform. In a waveform having a gradation value of a+4, the waveform is caused to rise up to V2 with the first waveform, to hold at V2 with the second waveform, to fall from V2 to V1 with the third waveform, to hold at V1 with the second waveform, and then to fall from V1 to V0 with the third waveform. In this case, the second waveform is controlled to different pulse height values (V1, V2). Controls for gradation values from b+1 to c, and from c+1 to d are executed in the same manner.

The gradation property of the image display apparatus can be more enhanced by the above waveform controls.

Next, the constitution of the image display apparatus for outputting the modulated pulses described above and the control method will be specifically explained.

<First Embodiment>
(Image Display Apparatus)

Figure 4:
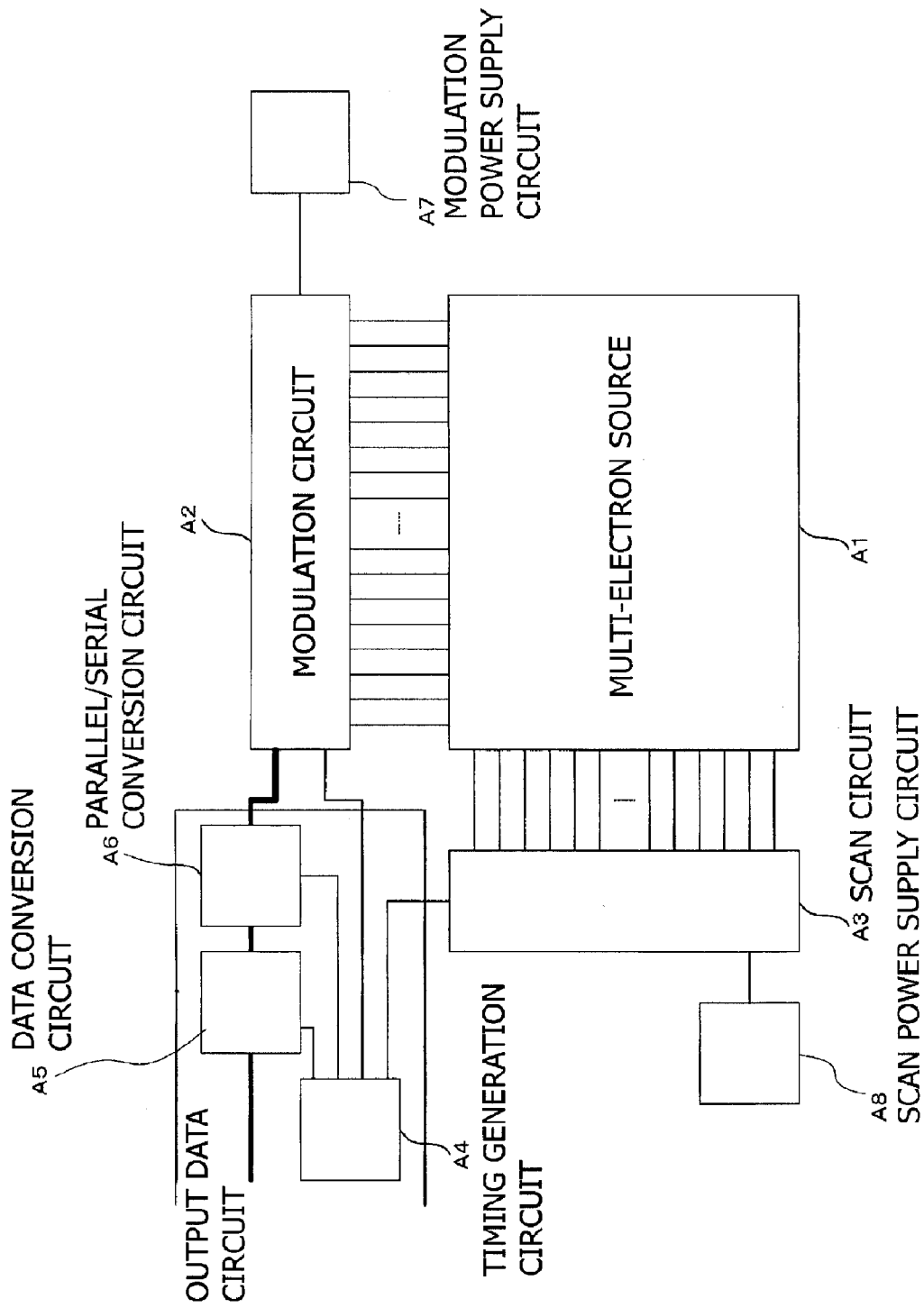
FIG. 4 is a block diagram showing a constitution of an image display apparatus.

FIG. 4 is a block diagram showing the constitution of an image display apparatus according to the first embodiment of the present invention. The image display apparatus has a multi-electron source A1 as a display panel (image display unit) and a drive unit for driving the multi-electron source A1.

The drive unit is composed of an output data circuit, a modulation circuit A2, a scan circuit A3, a modulation power supply circuit A7, and a scan power supply circuit A8. The output data circuit has a timing generation circuit A4, a data conversion circuit A5, a parallel/serial conversion circuit A6, and the like.

The multi-electron source A1 has a plurality of electron-emitting devices, a plurality of row wires, and a plurality of column wires, and the electron-emitting devices are formed to the intersection portions of the row wires and the column wires. When a selection electric potential is supplied to the row wires and a modulated pulse is supplied to the column wires, a drive voltage as a potential difference between the selection electric potential and the modulated pulse is applied to the electron-emitting devices. It is possible for desired electron-emitting device to emit light with desired luminance by appropriately controlling the period of time during which the drive voltage is applied and the value of the drive voltage.

The modulation circuit A2 is connected to the column wires of the multi-electron source A1. The modulation circuit A2 is a circuit for generating a modulation signal (modulated pulse) based on the image data supplied from the output data circuit and outputting the modulation signal to the respective column wires of the multi-electron source A1.

The modulation power supply circuit A7 is a power supply circuit configured such that it can output several voltage values. The modulation power supply circuit A7 not only supplies power to the modulation circuit A2 but also defines the voltage value of the modulated pulse output from the modulation circuit A2. Although the modulation power supply circuit A7 is usually a voltage source circuit, it is not necessarily limited thereto.

The scan circuit A3 is connected to the row wires of the multi-electron source A1. The scan circuit A3 is a circuit for selecting one or several of row wires to be driven among all the row wires and sequentially switching the row wires to be selected. In general, although the scan circuit A3 adopts line-sequential scanning in which the row wires are selected sequentially one by one, it is not limited thereto. The scan circuit A3 may adopt an interlaced scanning, or a scanning in which several adjacent rows are selected at a time (multi line scanning). The scan circuit A3 supplies the selection electric potential to a row wire (selected line) to be driven and supplies a non-selection electric potential to the other row wires (non-selected lines).

The scan power supply circuit A8 is a power supply circuit for outputting several voltage values (selection electric potential, non-selection electric potential). Although the scan power supply circuit A8 is usually a voltage source circuit, it is not necessarily limited thereto.

The timing generation circuit A4 is a circuit for generating a timing signal as control data for controlling the timings of the modulation circuit A2, the scan circuit A3, the data conversion circuit A5, and the parallel/serial conversion circuit A6.

The data conversion circuit A5 is a circuit for converting input luminance gradation data to image data suitable for the modulation circuit A2 and the multi-electron source A1. For example, the data conversion circuit A5 can perform various signal processing to the luminance gradation data, such as inverted γ conversion, luminance correction, color correction, resolution conversion, maximum value adjustment (limiter), and the like.

The parallel/serial conversion circuit A6 is a circuit for converting the image data output from the data conversion circuit 5 from parallel data to serial data and outputting the serial data to the modulation circuit A2.

(Modulation Circuit)

Figure 5:
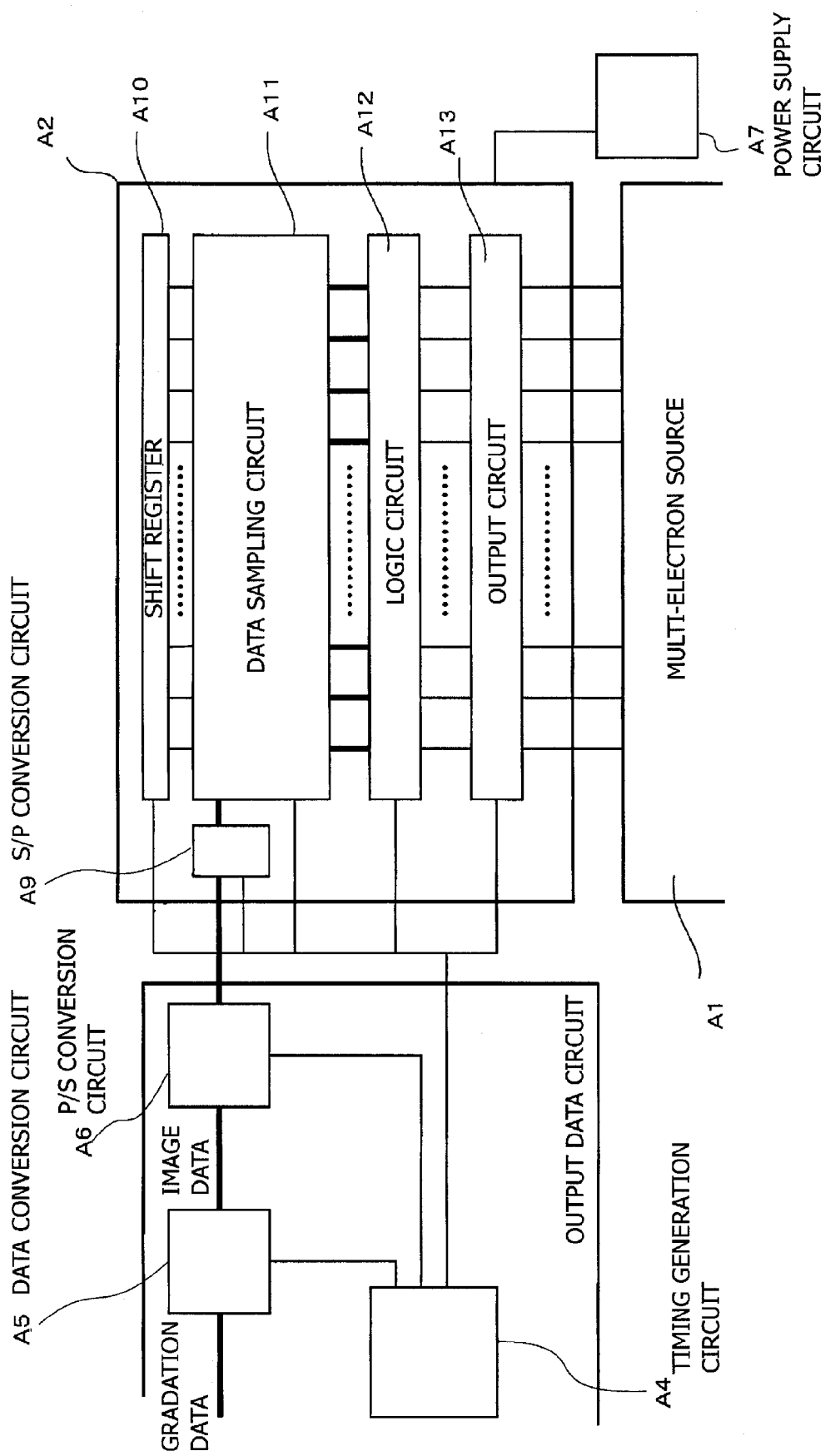
FIG. 5 is a block diagram showing a circuit constitution of a modulation circuit.

FIG. 5 is a block diagram showing the circuit configuration of the modulation circuit A2. The modulation circuit A2 is composed of a serial/parallel conversion circuit A9, a shift register A10, a data sampling circuit A11, a logic circuit A12, and an output circuit A13.

An operation of the modulation circuit A2 in the first embodiment will be explained.

The image data output from the output data circuit is converted into the parallel data in the serial/parallel conversion circuit A9. The image data converted into the parallel data is sequentially stored to the data sampling circuit A11 via the shift register A10.

Image data corresponding to the number of pixels (hereinafter, the number of pixels in the horizontal direction is shown by M) in a horizontal direction of the multi-electron source A1 is stored to the data sampling circuit A11. Thereafter, the logic circuit A12 generates a control signal (control sequence) of the output circuit A13 based on the image data for the respective pixels stored to the data sampling circuit A11 and sends the control signal to the output circuit A13.

The output circuit A13 generates a modulated pulse based on the control signal (control sequence) and outputs the modulated pulse to the column wires of the multi-electron source A1.

(Logic Circuit)

Figure 6:
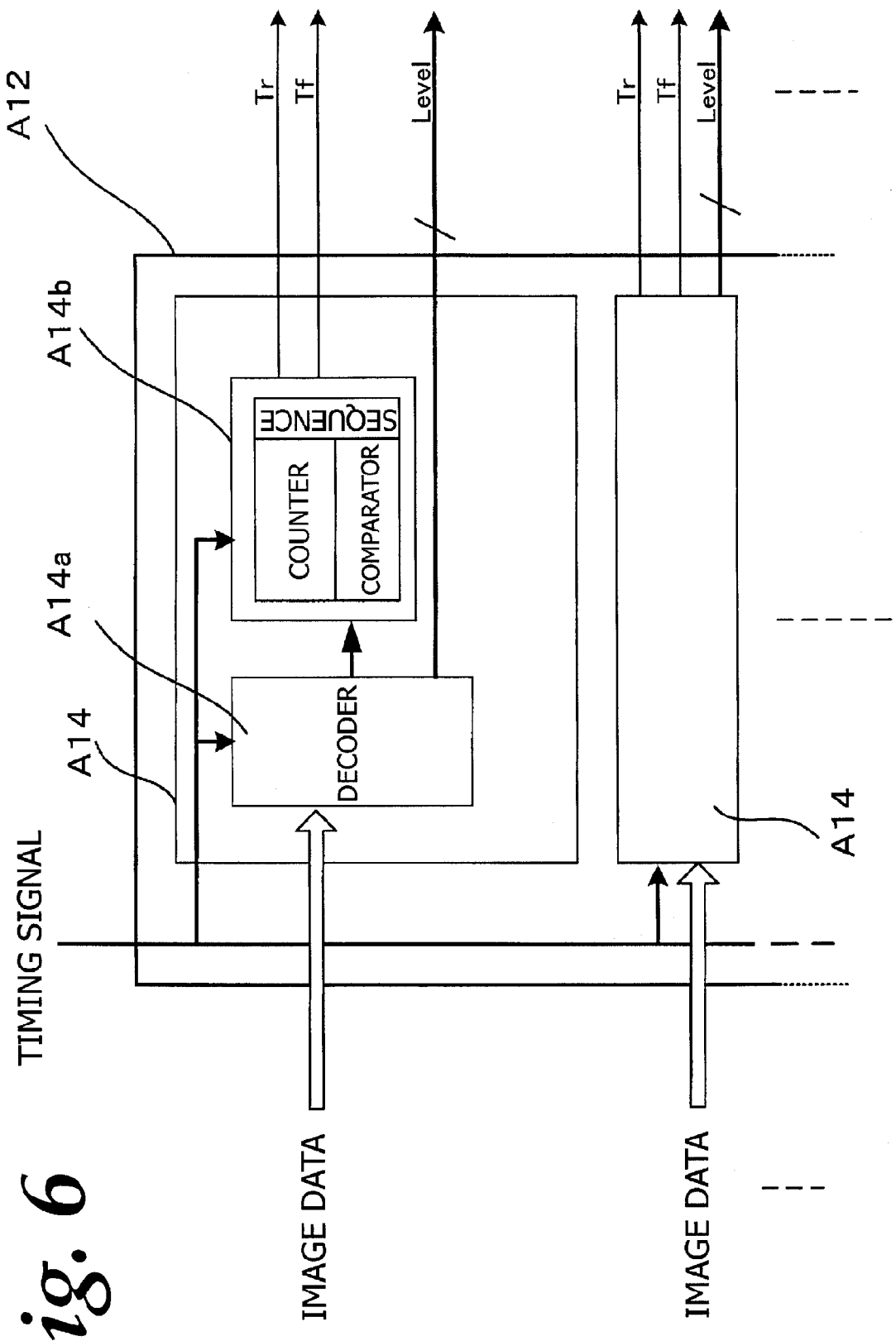
FIG. 6 is a block diagram showing a constitution of a logic circuit of the modulation circuit.

FIG. 6 is a block diagram showing the constitution of the logic circuit A12 of the modulation circuit.

The logic circuit A12 has M pieces of logic circuits A14. Each of the logic circuits A14 corresponds to each pixel. A specific constitution and operation of a logic circuit A14 for one pixel will be explained as an example.

The logic circuit A14 has a decoder A14a and a sequence generation circuit A14b. The image data sampled by the data sampling circuit A11 is input to the decoder A14a. From the image data and the timing signal which is output from the output data circuit, the decoder A14a generates control data for timings at which the modulated pulse rises and falls. The control data is input to the sequence generation circuit A14b and used as data for a comparator. Further, from the image data and the timing signal, the decoder A14a generates a control signal Level for defining the output level of the modulated pulse. The control signal Level is input to the output circuit A13.

The sequence generation circuit A14b counts the number of clocks based on a clock signal supplied as the timing signal. The comparator in the sequence generation circuit A14b compares the value counted by the sequence generation circuit A14b with control data for rising/falling timings. Then, a control signal Tr for defining timing at which the modulated pulse rises and a control signal Tf for defining timing at which the modulated pulse falls are generated based on the value of the comparator. The control signals Tr and Tf are input to the output circuit A13.

(Output Circuit)

Figure 7:
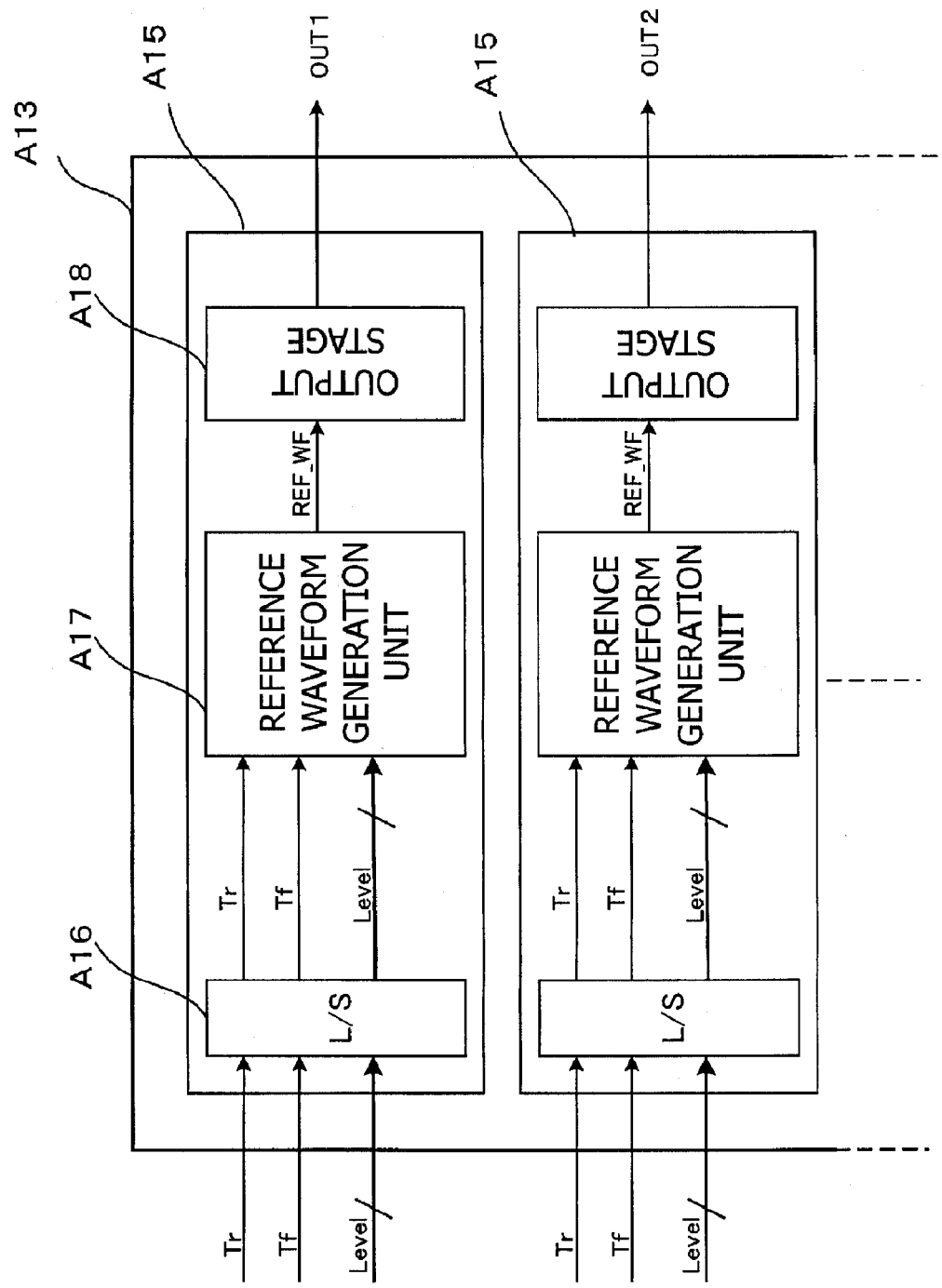
FIG. 7 is a block diagram showing a constitution of an output circuit of the modulation circuit.

FIG. 7 is a block diagram showing the constitution of the output circuit A13 of the modulation circuit.

The output circuit A13 has M pieces of output circuits A15. Each of the output circuits A15 corresponds to each pixel (each column wire). A specific constitution and operation of an output circuit A15 for one pixel will be explained as an example.

The output circuit A15 is composed of a level shift circuit A16, a reference waveform generation circuit A17, and an output stage A18.

The control signals Tr and Tf, Level sent from the logic circuit A14 are input to the output circuit A15. The level shift circuit A16 converts the voltages of the control signals Tr, Tf and Level from logic level into operation voltage level of the output circuit A15. The control signals Tr, Tf and Level output from the level shift circuit A16 are input to the reference waveform generation circuit A17.

Figure 8:
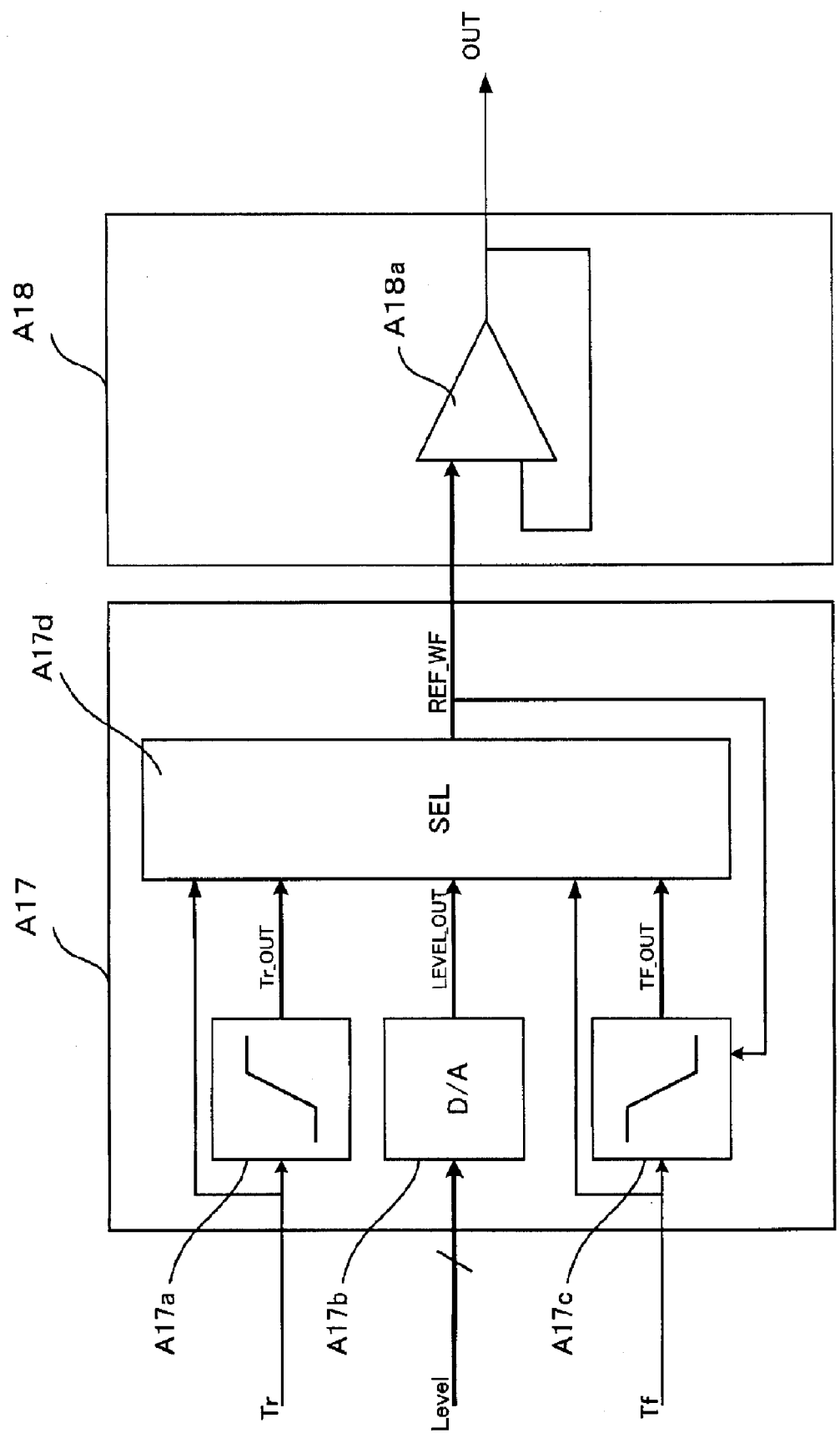
FIG. 8 is a block diagram showing a constitution of a reference waveform generation circuit according to a first embodiment.

FIG. 8 is a block diagram showing the constitution of the reference waveform generation circuit A17. The reference waveform generation circuit A17 is composed of a rising reference waveform generation unit A17a, an output level generation unit A17b, a falling reference waveform generation unit A17c, and a waveform switching unit A17d.

In this embodiment, the rising reference waveform generation unit A17a, the output level generation unit A17b, and the falling reference waveform generation unit A17c correspond to the first waveform generation unit, the second waveform generation unit, and the third waveform generation unit of the present invention, respectively. Further, the waveform switching unit A17d corresponds to the waveform switching unit of the present invention.

(Generation of Rising Waveform)

A rising waveform generating operation will be explained.

The control signal Tr whose level is shifted is input to the rising reference waveform generation unit A17a. On receiving the control signal Tr, the rising reference waveform generation unit A17a generates an up-slope waveform having a predetermined inclination and outputs it. The up-slope waveform (first waveform) may have any waveform as long as it is a waveform gently rising in a slope shape. The up-slope waveform is preferably a monotonically increasing waveform and more preferably a waveform having a constant inclination. This is because such waveform eases gradation control.

Figure 9:
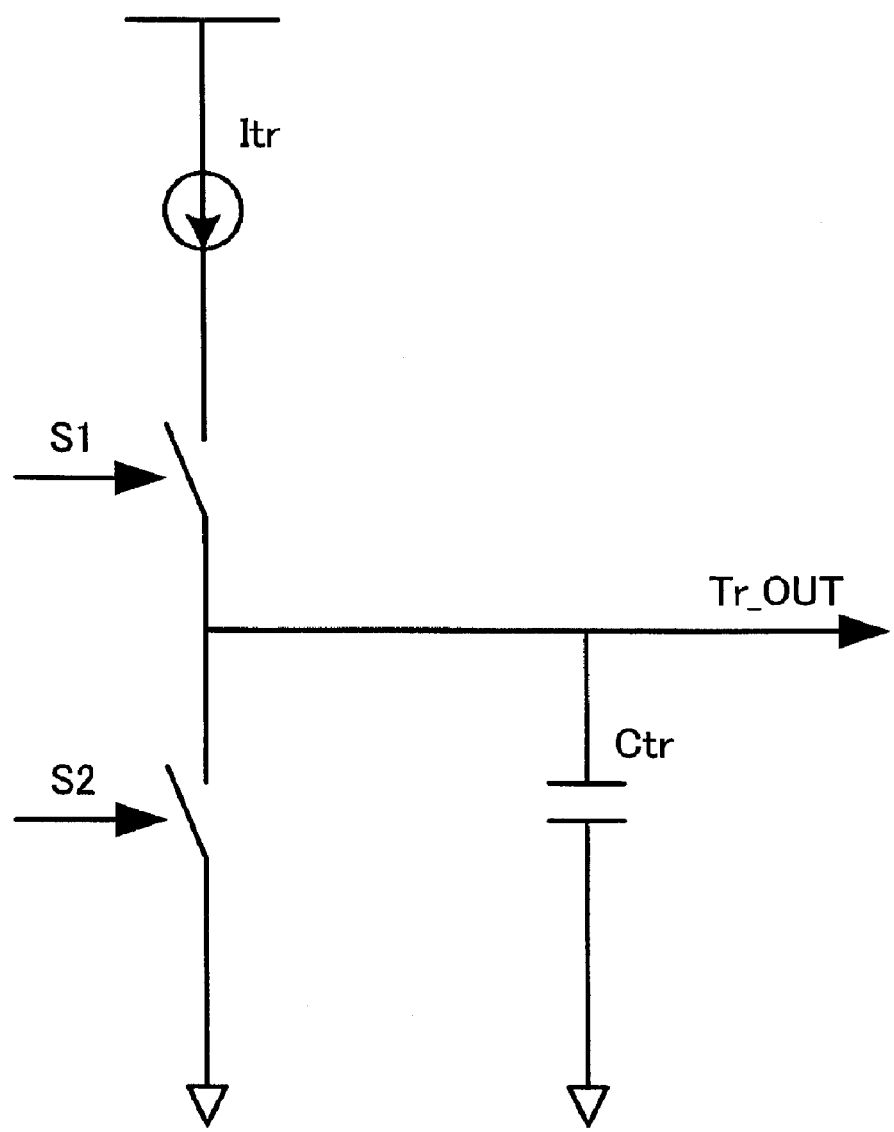
FIG. 9 shows an example of a constitution of a circuit for generating an up-slope waveform.

FIG. 9 shows an example of the constitution of a circuit for generating an up-slope waveform. The circuit is composed of switches S1, S2, a current source Itr, and a capacitor Ctr.

When the control signal Tr becomes on-state (High) the switch S1 is turned on, and the switch S2 is turned off. When the switch S1 is changed to the turned-on state, a certain amount of current flows from the current source Itr into the capacitor Ctr, and the capacitor Ctr is charged. With this operation, an output voltage Tr_OUT is formed in a waveform having a constant inclination.

When the control signal Tr is changed to off-state (Low), the switch S1 is turned off, and the switch S2 is turned on. With this operation, the capacitor Ctr is discharged, and the output voltage Tr_OUT is reduced to 0 V. Note that, a current source for supplying current toward the ground may be connected to the switch S2 side in this example.

(Generation of Output Level)

An output level generating operation will be explained.

The control signal Level whose level is shifted is input to the output level creation unit A17b. The output level creation unit A17b performs digital/analog conversion on the control signal Level and outputs a voltage level signal LEVEL_OUT having a constant voltage. The voltage level signal LEVEL_OUT has a waveform (second waveform) for defining the maximum pulse height value of the modulated pulse.

(Generation of Falling Waveform)

A falling waveform generating operation will be explained.

The control signal Tf whose level is shifted is input to the falling reference waveform generation unit A17c. The falling reference waveform generation unit A17c receives the voltage of a reference waveform REF_WF output from the waveform switching unit A17d at all times. The reason why the falling reference waveform generation unit A17c receives the voltage of the reference waveform REF_WF at all times resides in that it generates a falling waveform from the voltage level output from the waveform switching unit A17d. More specifically, when the control signal Tf is input, the falling reference waveform generation unit A17c generates a down-slope waveform having a predetermined inclination from the voltage value of the reference waveform REF_WF and outputs an output voltage Tf_OUT.

The down-slope waveform (third waveform) may have any waveform as long as it is a waveform gently falling in a slope shape. The down-slope waveform is preferably a monotonically decreasing waveform and more preferably a waveform having a constant inclination. This is because such waveform eases gradation control.

Figure 10:
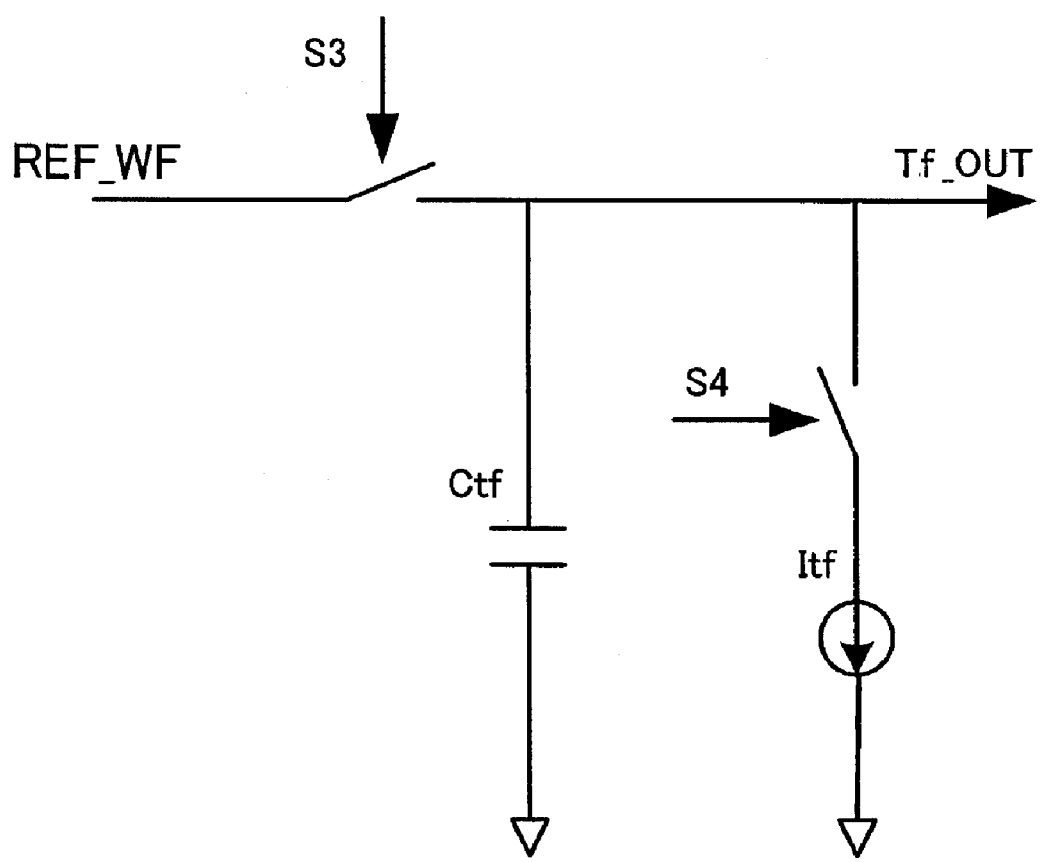
FIG. 10 shows an example of a constitution of a circuit for generating a down-slope waveform.

FIG. 10 shows an example of the constitution of a circuit for generating the down-slope waveform. The circuit is composed of switches S3, S4, a current source Itf, and a capacitor Ctf.

When the control signal Tf becomes on-state (High) the switch S3 is turned on, and the switch S4 is turned off. Accordingly, the capacitor Ctf, to which the same voltage as that of the reference waveform REF_WF t, is charged.

When the control signal Tf becomes off-state (Low) the switch S3 is turned off, and the switch S4 is turned on. With this operation, the output voltage Tf_OUT is made to a falling waveform which falls from the voltage of the reference waveform REF_WE just before the start of falling with a constant inclination and eventually becomes the ground level.

(Generation of Output Waveform)

A waveform switching operation and an output waveform operation will be explained.

The waveform switching unit A17d generates the reference waveform REF_WF by switching the reference waveform (output voltage) of the rising reference waveform generation unit A17a, the output level generation unit A17b, and the falling reference waveform generation unit A17c based on the control signals Tr, Tf and outputs the reference waveform REF_WF to the output stage A18.

Specifically, when the control signal Tr is High, the waveform switching unit A17d selects the output voltage Tr_OUT of the rising reference waveform generation unit A17a, whereas when the control signal Tr is Low, the waveform switching unit A17d selects the output voltage LEVEL_OUT of the output level generation unit A17b.

Further, when the control signal Tf is High, the waveform switching unit A17d operates according to the logic for the control signal Tr, whereas when the control signal Tf is Low, the waveform switching unit A17d selects the output voltage Tr_OUT of the falling reference waveform generation unit A17c.

The output stage A18 refers to the output waveform REF_WF from the waveform switching unit A17d and generates a modulated pulse having the same waveform or a similar waveform. The modulated pulse OUT is output to the column wires of the multi-electron source A1. The output stage A18 is preferably configured as a unity gain buffer using an operation amplifier A18a as shown in FIG. 8. Further, the output stage A18 may employ a constitution of an amplifier stage of the operation amplifier.

OPERATION EXAMPLE 1

Figure 11:
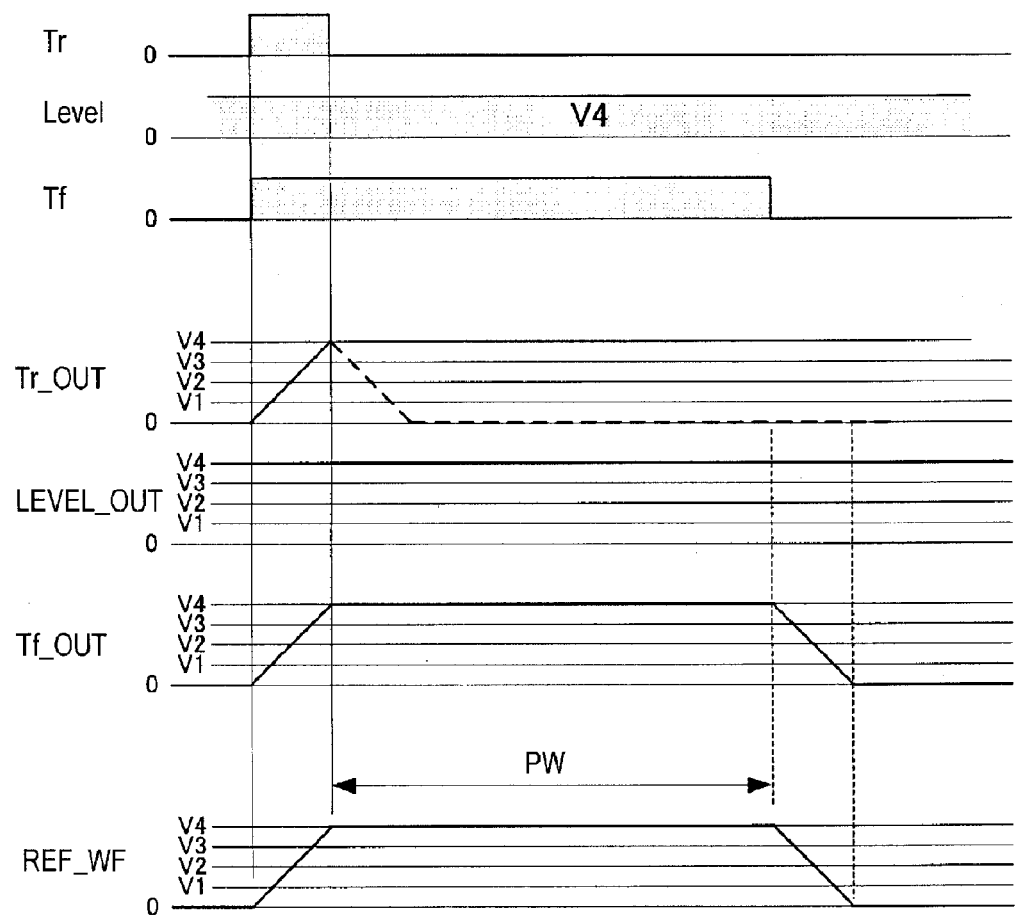
FIG. 11 is a timing chart showing an operation example 1 of the output circuit.
Figure 12:
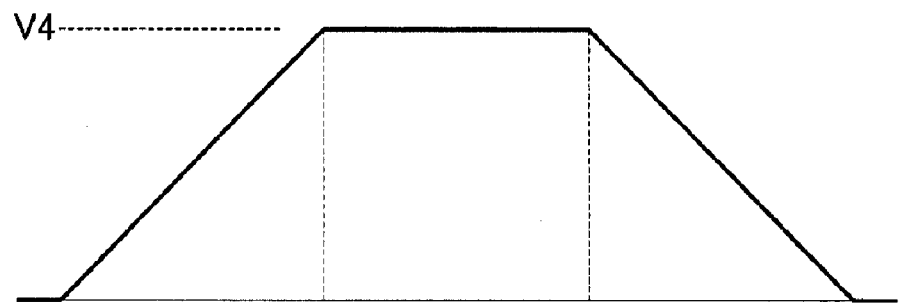
FIG. 12 is a logic table of the operation example 1.

An example of operation timing of the output circuit A15 will be explained referring to FIGS. 11 and 12. FIG. 11 is a timing chart showing an operation example 1 of the output circuit A15, and FIG. 12 is a logic table of the operation example 1. The operation example 1 is a control when a modulated pulse having a maximum voltage level (V4) is output.

The control signal Level is input to the output level generation unit A17b, and the voltage level signal LEVEL_OUT is output. In the example, level V4 is output.

When the control signal Tr is at High level, the rising reference waveform generation unit A17a outputs a rising waveform Tr_OUT having a constant inclination. When the control signal Tr is at Low level, Tr_OUT is set to 0 V (ground level).

When the control signal Tr is at High level, the falling reference waveform generation unit A17c takes in a voltage of REF_WF. The falling reference waveform generation unit A17c keeps taking in the voltage of RE_WF until the control signal Tf is set to Low level and then outputs the voltage REF_WF as Tf_OUT. When the control signal Tf is set to Low level, Tf_OUT falls from REF_WF in a constant inclination and is set to 0 V eventually.

When the control signal Tr is set to High level, the waveform switching unit A17d selects and outputs a reference waveform Tr_OUT output from the rising reference waveform generation unit A17a. In FIG. 11, the control signal Tr is kept High during a period in which a voltage of Tr_OUT reaches the V4 level.

When the control signal Tr is set to Low level, the waveform switching unit A17d selects and outputs LEVEL_OUT, in case that the control signal Tf is at High level. In case that the control signal Tf is at Low level, the waveform switching unit A17d selects and outputs Tf_OUT.

With the above operation, the reference waveform REF_WF for an output waveform rises from the ground level with a constant inclination, outputs a designated voltage level, and then falls to the ground level with a constant inclination.

OPERATION EXAMPLE 2

Figure 13:
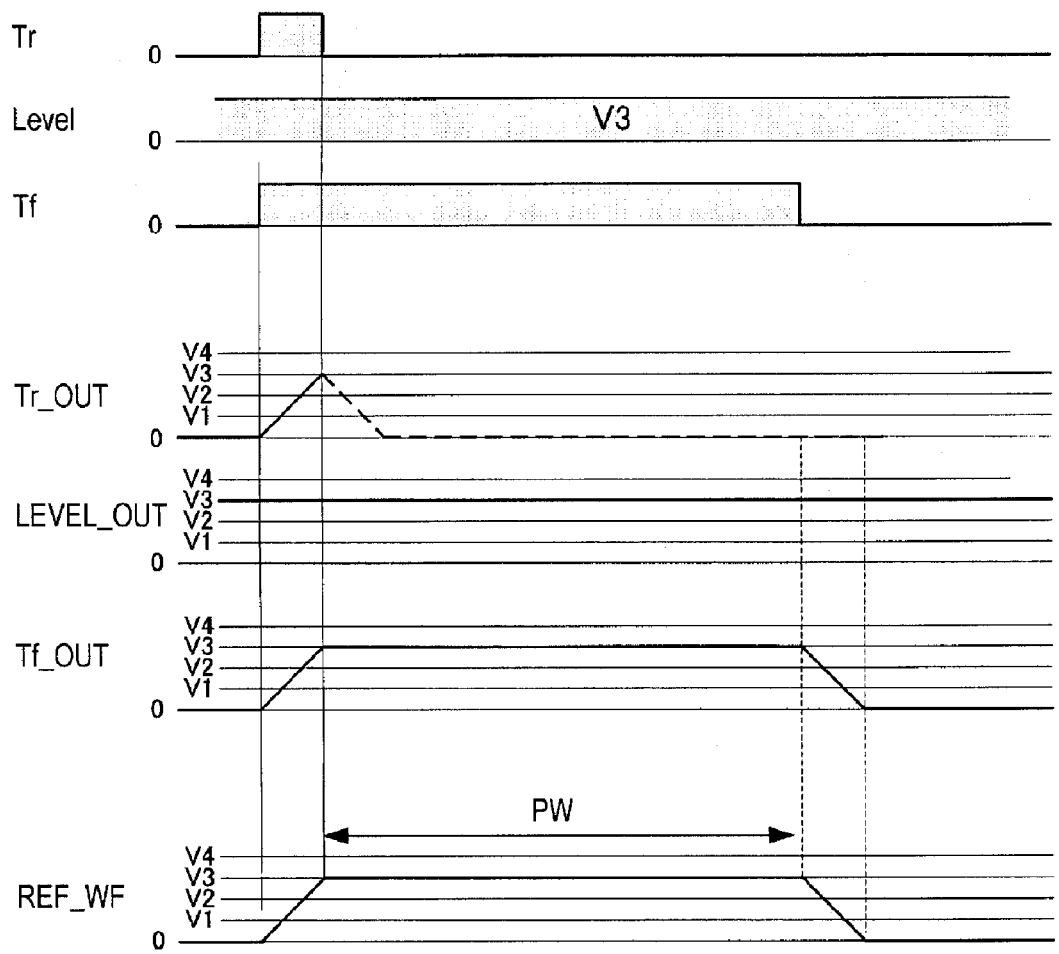
FIG. 13 is a timing chart showing an operation example 2 of the output circuit.
Figure 14:
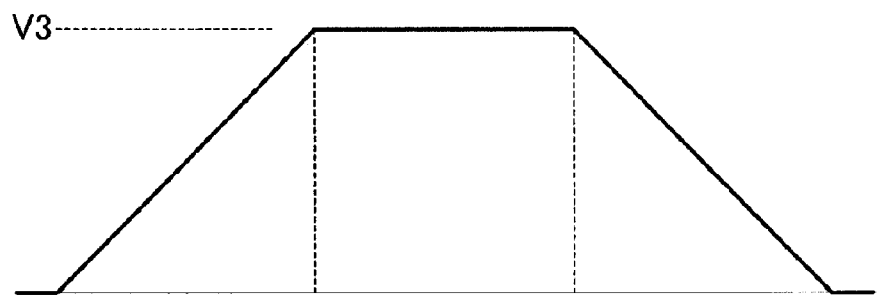
FIG. 14 is a logic table of the operation example 2.

An example of operation timing of the output circuit A15 will be explained referring to FIGS. 13 and 14. FIG. 13 is a timing chart showing an operation example 2 of the output circuit A15, and FIG. 14 is a logic table of the operation example 2. The operation example 2 shows a control when a modulated pulse having an output level (V3) lower than that of the operation example 1 is output.

The operation example 2 is different from the operation example 1 in that the voltage of the control signal Level is level V3 and that the High period of the control signal Tr is made short. The High period of the control signal Tr is determined depending on a period of time necessary to cause the reference waveform to rise up to the output voltage level V3. As described above, a smooth waveform can be generated by controlling the High period of the control signal Tr according to the output voltage level.

A period PW in which the output voltage level is output can be controlled by adjusting the High period of the control signals Tr and Tf. With this operation, the pulse width of the reference waveform REF_WF can be controlled.

Note that output waveforms having other output voltage levels V1 and V2 can be generated likewise.

(Independent Adjustment of RGB)

Both the operation examples 1, 2 described above execute the pulse width modulations, but the maximum pulse height value of the pulse are different each other. The pulse width modulations having the different maximum pulse height value can be preferably used to, for example, color adjustment, adjustment of gradation control characteristics for each color, and the like.

The image display apparatus of the embodiment realizes RGB emission by collision of the electrons emitted from the multi-electron source against a surface on which RGB phosphors are coated. However, phosphors ordinarily have different light emitting efficiencies in the respective RGB colors. Accordingly, even if the same amounts of electrons (charge amount) are discharged to the phosphors of the respective colors, resultant amounts of emission are not the same. To cope with the above problem, RGB can be emitted in the same amount by individually setting drive voltage values to each of RGB in consideration of the light emitting efficiencies and executing the pulse width modulation in the voltage levels.

A specific example will be explained referring to FIGS. 15A to 15F.

FIG. 15A shows the characteristics of the drive voltage Vf vs. emission current Ie of electron-emitting devices formed on the multi-electron source. FIG. 15B shows a drive waveform applied to the electron-emitting devices of the respective RGB colors. Here, the same drive voltage Vd is applied to the respective RGB colors. FIG. 15C shows the luminance characteristics of the respective RGB colors to image data. In the example, when the phosphors have the emission efficiencies of R>G>B. If all the devices for RGB colors are driven by the same drive voltage, it can be found that luminance is different as shown by R>G>B even if the same image data is used.

To cope with the above problem, the drive voltages of the respective colors are set such that an electron-emitting device corresponding to a phosphor having a higher light emitting efficiency is driven by a lower drive voltage as shown in FIG. 15D. In an example of FIG. 15D, a drive voltage Vr for R is set lower than Vd, a drive voltage Vg for G is set to the same as Vd, and a drive voltage Vb for B is set higher than Vd. As a result, pulse width modulations having different maximum pulse height values (output voltage levels) are executed for the respective RGB colors as shown in FIG. 15E. When the electron-emitting devices are driven by the pulse width modulations as described above, the luminance characteristics of the respective RGB colors can be caused to coincide with each other as shown in FIG. 15F.

The gradation characteristics of the respective RGB colors can be adjusted by appropriately selecting the drive voltage values of the respective RGB colors as described above. Note that when a non-linear gradation control such as adjustment of γ characteristics and the like are executed, the non-linear gradation control can be executed by appropriately selecting image data.

OPERATION EXAMPLE 3

Figure 16:
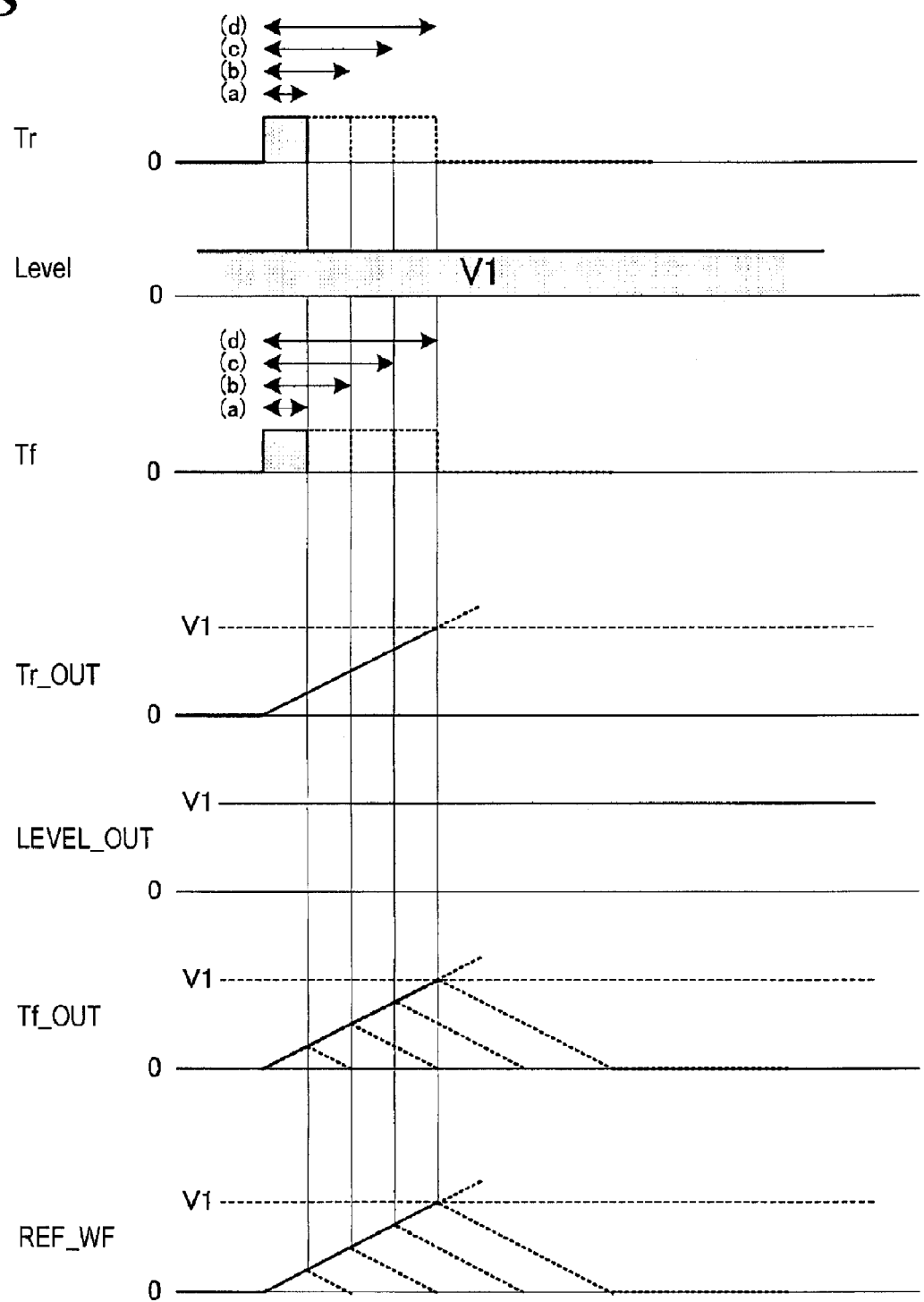
FIG. 16 is a timing chart showing an operation example 3 of the output circuit.

An example of operation timing of the output circuit A15 will be explained referring to FIGS. 16 and 17. FIG. 16 is a timing chart showing an operation example 3 of the output circuit A15, and FIG. 17 is a logic table of the operation example 3.

The operation example 3 is different from the operation examples 1 and 2 in that the operation example 3 does not output the voltage level signal LEVEL_OUT having a constant voltage and a rising waveform is instantly switched to a falling waveform. That is, although the modulated pulses of the operation examples 1 and 2 have the trapezoidal waveform, a modulated pulse of the operation example 3 has a triangular waveform. The triangular waveform is preferably used to drive, for example, a low gradation.

FIG. 16 shows an example for generating a triangular waveform from 0 V to a V1 level.

Figure 17:
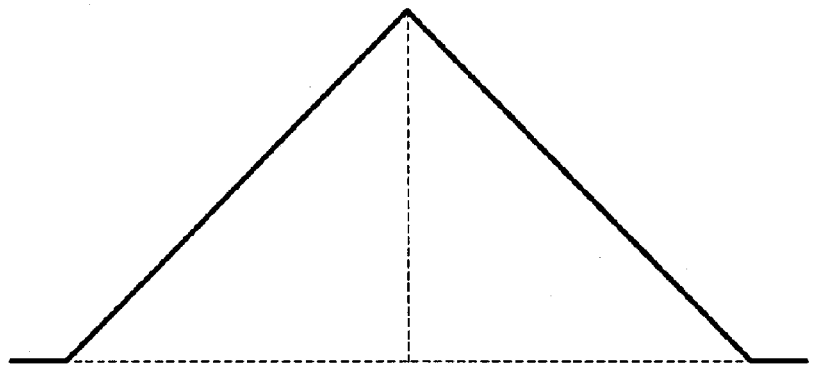
FIG. 17 is a logic table of the operation example 3.

As apparent from FIGS. 16 and 17, a triangular reference waveform REF_WF is generated by that both control signals Tr and Tf are switched from High level to Low level at the same timing. The size of triangular waveform can be increased by increasing High period of the control signals Tr and Tf. In the example of FIG. 16, the length of High period is set to (a)>(b)>(c)>(d), and the pulse height value of the triangular waveform reaches the V1 level in case of (d).

Although FIG. 16 explains the example of the triangular waveform between the 0 V and the V1 level, the triangular waveform can be also output between other voltage levels by appropriately setting the control signals Tr and Tf.

It should be noted that, in the circuit constitution of this embodiment, each of the output circuits A15 has the rising reference waveform generation unit A17a, the output level generation unit A17b, and the falling reference waveform generation unit A17c. Accordingly, each of the output circuits A15 for M pixels can independently control timing at which a modulated pulse rises, a voltage level and an output period thereof, and timing at which the modulated pulse falls. In other words, the modulated pulse can be caused to rise and fall at different timing and the voltage level can be made different for each pixel (each column wire).

<Second Embodiment>

Figure 18:
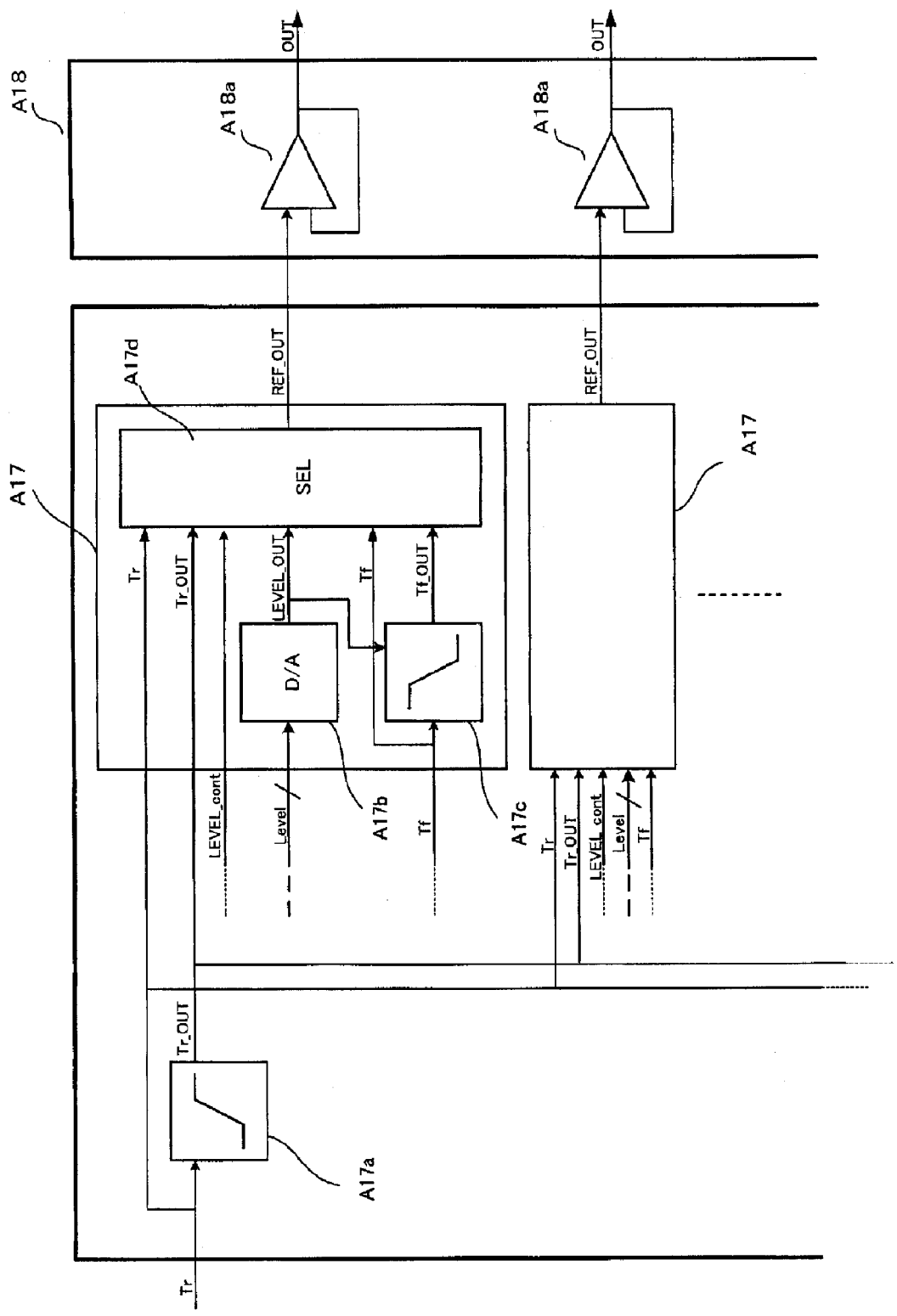
FIG. 18 is a block diagram showing a constitution of a reference waveform generation circuit according to a second embodiment.

FIG. 18 is a block diagram showing the constitution of a reference waveform generation circuit A17 according to a second embodiment of the present invention.

The second embodiment is different from the first embodiment in that a plurality of the reference waveform generation circuits A17 shares a common rising reference waveform generation unit A17a and that the second embodiment has a control signal LEVEL_cont for defining timing at which a voltage level signal LEVEL_OUT is output. That is, although the second embodiment has an output level generation unit A17b, a falling reference waveform generation unit A17c, and a waveform switching unit A17d disposed to each of column wires, the number of the rising reference waveform generation units A17a is smaller than that of the column wires. In general, a modulation circuit A2 is composed of one or a more integrated circuits (IC chips), and several output circuits A15 are disposed in one integrated circuit. The chip size can be reduced by employing such a configuration that all the output circuits A15 in the integrated circuit commonly use the one rising reference waveform generation unit A17a. Note that the configuration of the second embodiment can be applied to a control in which a start timing and operational timing of the rising waveform are always the same.

OPERATION EXAMPLE 4

Figure 19:
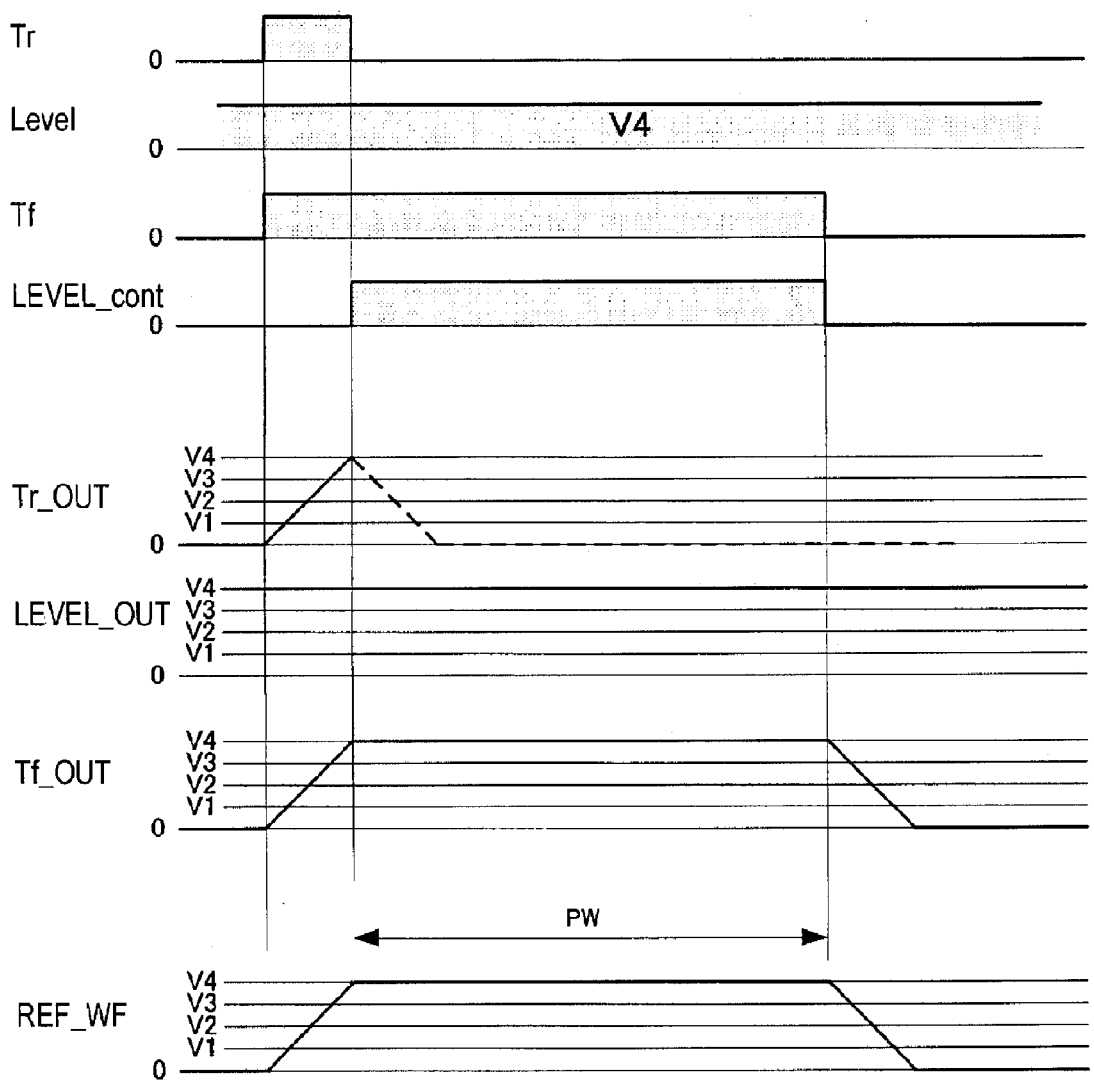
FIG. 19 is a timing chart showing an operation example 4 of the output circuit.
Figure 20:
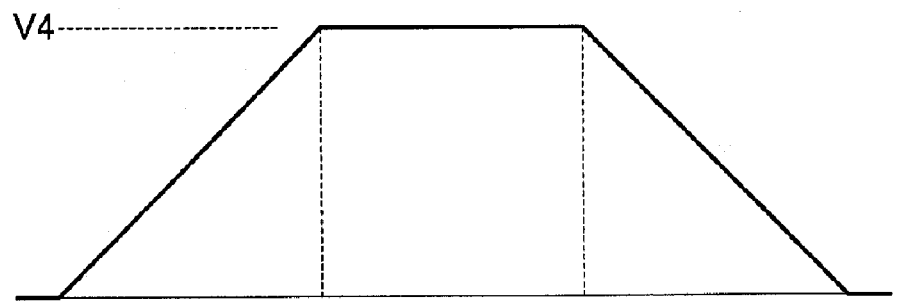
FIG. 20 is a logic table of the operation example 4.

An example of the operation timing of the output circuit A15 of the second embodiment will be explained referring to FIGS. 19 and 20. FIG. 19 is a timing chart showing an operation example 4 of the output circuit A15, and FIG. 20 is a logic table of the operation example 4.

A control signal Level is input to the output level generation unit A17b, and a voltage level signal LEVEL_OUT is output. Although level V4 is output in the example, the same operation is executed in a level other than the V4 level.

The control signal LEVEL_cont is a signal for defining timing at which the voltage of the voltage level signal LEVEL_OUT is output. In the first embodiment, the control signal LEVEL_cont can select the signal LEVEL_OUT by setting the control signal Tr of each output circuit to Low. However, when the rising reference waveform generation unit A17a is shared as in the second embodiment, since there is a possibility that timing, at which an up-slope waveform is switched to an output having a constant level, is different in each of output circuits, a control signal such as the signal LEVEL_OUT is necessary.

When the control signal Tr is at High level, the rising reference waveform generation unit A17a outputs a rising waveform Tr_OUT having a constant inclination. When the control signal Tr is at Low level, the rising waveform Tr_OUT is set to 0 V (ground level).

When the control signal Tr is at High level, the falling reference waveform generation unit A17c takes in a voltage of REF_WF. The falling reference waveform generation unit A17c keeps taking in the voltage of REF_WF until the control signal Tf is set to Low level and then outputs the voltage as Tr_OUT. When the control signal Tf is set to Low level, Tf_OUT falls from REF_WF in a constant inclination and eventually becomes 0 V.

The control signal Level is input to the output level generation unit A17b, and the voltage level signal LEVEL_OUT having a constant level is output.

The control signal LEVEL_cont is input to the waveform switching unit A17d. When the control signal LEVEL_cont is High, the waveform switching unit A17d selects LEVEL_OUT, and when the control signal LEVEL_cont is Low, the waveform switching unit A17d operates according to other logic.

The output operation will be explained below. When the control signal Tr is set to High level, the waveform switching unit A17d selects the reference waveform Tr_OUT output from the rising reference waveform generation unit A17a and outputs the rising reference waveform. When the control signal LEVEL_cont is set to High level, the waveform switching unit A17d selects LEVEL_OUT and outputs a level voltage (here, V4). When the control signal LEVEL_cont is set to Low level and the control signal Tf is set to High level, the waveform switching unit A17d selects Tf_OUT and outputs a falling waveform.

Note that since the control signal Tr is used as a timing signal of several output circuits, it is set to High level while at least one output circuit rises and set to Low level after the rising of all the output circuits is completed.

Although the example in which the output voltage level is V4 is explained in the second embodiment, an output waveform having other voltage level can be generated likewise.

Further, in the circuit configuration of the second embodiment, each of the output circuits A15 has the output level generation unit A17b and the falling reference waveform generation unit A17c. Accordingly, each of the output circuits A15 for M pixels can independently control a voltage level, an output period thereof, and timing at which the voltage level falls. In other words, the modulated pulse can be caused to fall at different timing and the voltage level can be made different for each pixel (each column wire).

OPERATION EXAMPLE 5

Although LEVEL_OUT is set to a constant voltage level in the operation examples 1 to 4 described above, the voltage level of LEVEL_OUT can be also changed by changing the designating value of the control signal Level in one horizontal period (1H).

Figure 21:
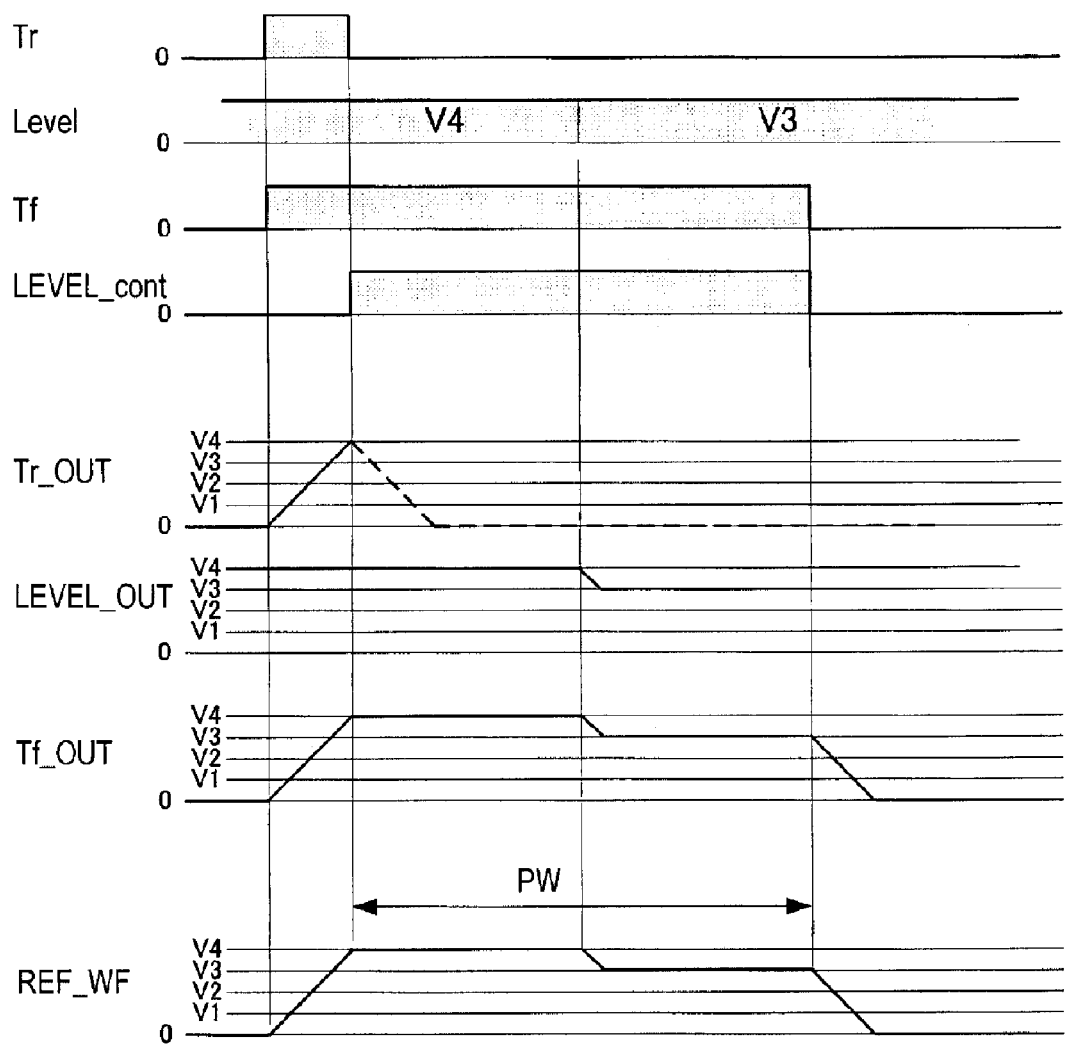
FIG. 21 is a timing chart showing an operation example 5 of the output circuit.

FIG. 21 is a timing chart showing an operation example 5 of the output circuit A15, and FIG. 22 is a logic table of the operation example 5.

Although LEVEL_OUT is set to the V4 level at all times during the period in which the control signal Level is at High level in the operation example 4, LEVEL_OUT is switched from the V4 level to the V3 level at certain timing in the operation example 5. With this operation, the output level can be changed in the one horizontal period (1H).

Note that although an example for changing the output level from V4 to V3 is explained here, the output level can be arbitrarily changed by controlling the control signal Level. The output level can be also changed at two or more stages in the one horizontal period (1H). Further, although the operation example 5 is realized by the circuit configuration of the second embodiment here, a similar modulated pulse waveform can be also generated using the circuit configuration of the first embodiment.

(Modification of Output Stage)

Figure 23:
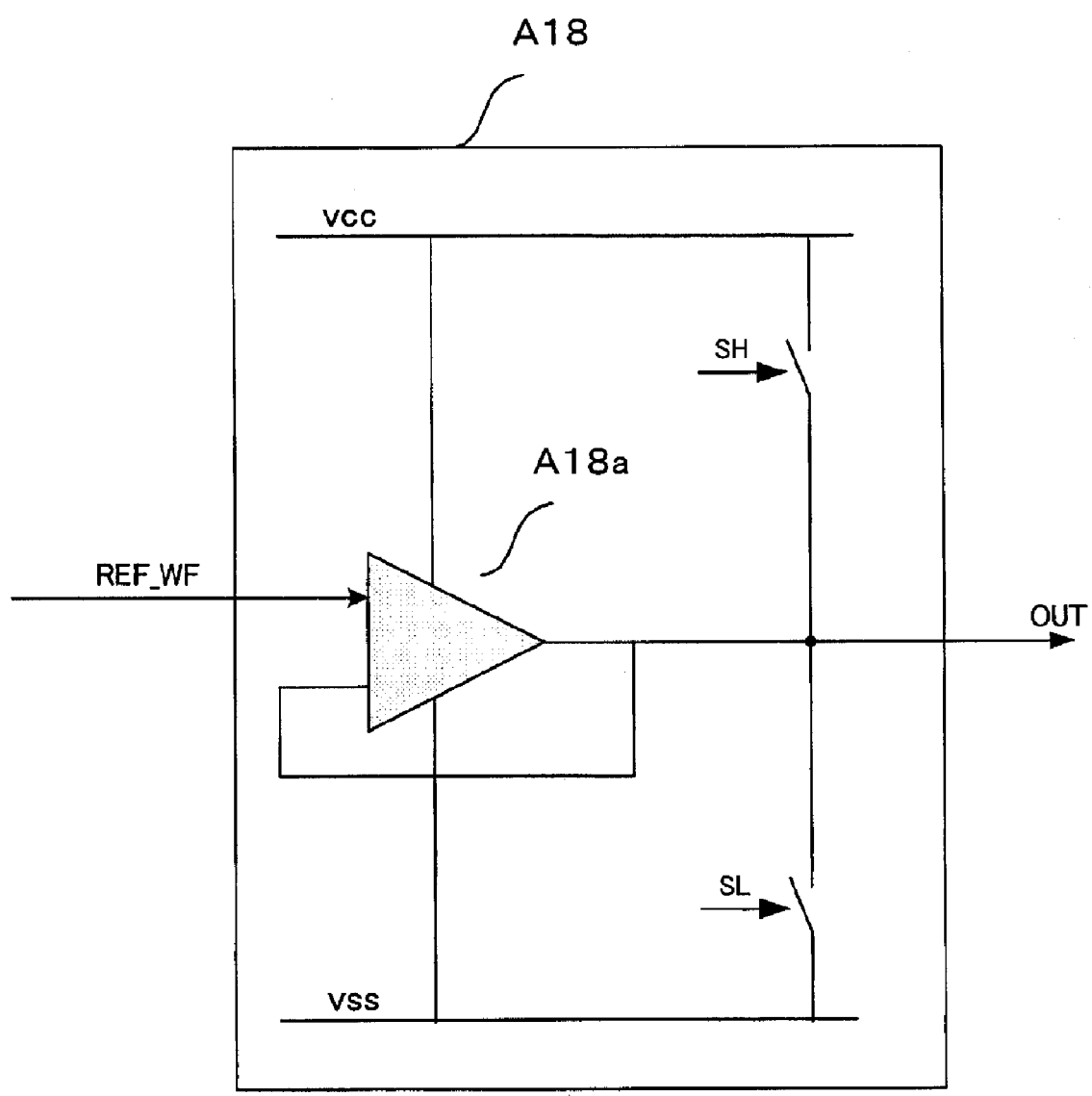
FIG. 23 is a view showing a circuit arrangement of an output stage.

The output stage A18 of the above embodiments employs a configuration for outputting a reference waveform by an amplifier or a buffer. When an output having the same level as that of a power supply voltage is necessary here, it is preferable to provide switches SH and SL for outputting power supply voltages as shown in FIG. 23. With this configuration, outputs having the same levels as those of power supply voltages VCC and VSS can be stably obtained.

Specifically, a power supply voltage VCC can be directly output in such a manner that the rising portion thereof is raised by the operation amplifier A18a and thereafter the switch SH is turned on. At the time of falling, a power supply voltage (reference voltage) VSS can be directly output in such a manner that the switch SH is turned off, the voltage is completely dropped by the operation amplifier A18a, and thereafter the switch SL turned on.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-095453, filed on Apr. 1, 2008, which is hereby incorporated by reference herein in its entirety.

What is claimed is:

1. A control method of an image display apparatus which comprises a display panel in which a plurality of display devices are arranged in matrix with a plurality of column wires and a plurality of row wires, the method comprising the steps of:

outputting a selection electric potential to a row wire to be driven; and generating a modulated pulse based on image data and outputting the modulated pulse to the column wires, wherein in the step of generating and outputting the modulated pulse, supposing that n is an integer of at least 1, t2 is a value larger than t1, h2 is a value larger than h1, k is an integer of at least 1, and f(k) increases as k is increased, (1) in case of outputting a modulated pulse corresponding to gradation value n, a control is executed to cause the modulated pulse to rise in a slope shape so that the pulse height value reaches h1 in a period of time t1 from the start time of outputting the modulated pulse and to cause the modulated pulse to fall so that the pulse height value decreases from the time at which the period of time t1 has passed from the start time of outputting the modulated pulse; and (2) in case of outputting a modulated pulse corresponding to gradation value n+k, a control is executed to cause the modulated pulse to rise in a slope shape so that the pulse height value reaches h2 in a period of time t2 from the start time of outputting the modulated pulse, to hold the pulse height value at h2 until a period of time t2+f(k) passes from the start time of outputting the modulated pulse, and thereafter to cause the pulse height value to decrease.

2. A control method of an image display apparatus according to claim 1, wherein when t3 is a value smaller than t1 and h3 is a value smaller than h1 at the step of outputting the modulated pulse, (3) in case of outputting a modulated pulse corresponding to gradation value n−1, a control is executed to cause the modulated pulse to rise in a slope shape so that the pulse height value reaches h3 in a period of time t3 from the start time of outputting the modulated pulse and to cause the pulse height value to decrease from the time at which the period of time t3 has passed from the start time of outputting the modulated pulse.

3. A control method of an image display apparatus according to claim 1, wherein the modulated pulse is caused to fall so that the pulse height value thereof decreases in a slope shape at the step of outputting the modulated pulse.

* * * * *